(12) United States Patent
Noma et al.

(10) Patent No.: US 11,563,145 B2
(45) Date of Patent: Jan. 24, 2023

(54) LIGHT SOURCE, LIGHT SOURCE DEVICE AND METHOD OF MANUFACTURING LIGHT SOURCE

(71) Applicant: NICHIA CORPORATION, Anan (JP)

(72) Inventors: Shintaro Noma, Anan (JP); Tsuyoshi Okahisa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/537,467

(22) Filed: Nov. 29, 2021

(65) Prior Publication Data

US 2022/0173271 A1 Jun. 2, 2022

(30) Foreign Application Priority Data

Nov. 30, 2020 (JP) .............................. JP2020-198840

(51) Int. Cl.
*H01L 33/08* (2010.01)
*H01L 33/50* (2010.01)
*H01L 33/52* (2010.01)

(52) U.S. Cl.
CPC ............ *H01L 33/08* (2013.01); *H01L 33/507* (2013.01); *H01L 33/52* (2013.01); *H01L 2933/0033* (2013.01)

(58) Field of Classification Search
CPC ........ H01L 33/08; H01L 33/507; H01L 33/52
See application file for complete search history.

(56) References Cited

U.S. PATENT DOCUMENTS

| | | | |
|---|---|---|---|
| 10,734,540 B1* | 8/2020 | Chen | ........................ H01L 33/44 |
| 2011/0121731 A1 | 5/2011 | Tsutsumi et al. | |
| 2013/0329440 A1 | 12/2013 | Tsutsumi et al. | |
| 2015/0207045 A1 | 7/2015 | Wada et al. | |
| 2016/0144771 A1 | 5/2016 | Miyachi et al. | |
| 2016/0148912 A1 | 5/2016 | Higashino | |
| 2017/0098743 A1 | 4/2017 | Chen et al. | |
| 2018/0040779 A1 | 2/2018 | Baek et al. | |
| 2018/0175239 A1 | 6/2018 | Hayashi | |

(Continued)

FOREIGN PATENT DOCUMENTS

| | | | |
|---|---|---|---|
| JP | 2011-108589 A | 6/2011 | |
| JP | 2012-169189 A | 9/2012 | |

(Continued)

*Primary Examiner* — Tracie Y Green
(74) *Attorney, Agent, or Firm* — Global IP Counselors, LLP

(57) ABSTRACT

A light source includes light emission units and a light shielding member. At least one of the light emission units includes a light emitting element, a wavelength conversion member, and a light transmissive member. The light transmissive member includes a first region positioned above the light emitting element and a second region positioned outward from the first region. The second region has a thickness smaller than a thickness of the first region. The wavelength conversion member is larger than the light emission face of the light emitting element in a top view. The light shielding member is continuously disposed between adjacent ones of the light emission units and covers a lateral face of the light emitting element and a lateral face of the wavelength conversion member. A lateral face of the light transmissive member in the light emission unit is at least partially exposed from the light shielding member.

22 Claims, 18 Drawing Sheets

(56) References Cited

U.S. PATENT DOCUMENTS

| | | |
|---|---|---|
| 2018/0294388 A1 | 10/2018 | Hung et al. |
| 2019/0154236 A1 | 5/2019 | Ozeki et al. |
| 2019/0165218 A1 | 5/2019 | Nakai et al. |
| 2019/0319176 A1 | 10/2019 | Sato |
| 2020/0295532 A1* | 9/2020 | Sogo .................. H01S 5/06825 |
| 2021/0313302 A1* | 10/2021 | Kadan .................... H01L 33/62 |
| 2021/0382225 A1* | 12/2021 | Kasai .................... G02B 6/0021 |
| 2022/0199867 A1* | 6/2022 | Fujioka .................. H01L 33/52 |

FOREIGN PATENT DOCUMENTS

| | | |
|---|---|---|
| JP | 2013-187371 A | 9/2013 |
| JP | 2014-179407 A | 9/2014 |
| JP | 2015138838 A | 7/2015 |
| JP | 2016-100252 A | 5/2016 |
| JP | 2016100457 A | 5/2016 |
| JP | 2016219637 A | 12/2016 |
| JP | 2017108111 A | 6/2017 |
| JP | 2018139285 A | 9/2018 |
| JP | 2019-096675 A | 6/2019 |
| JP | 2019-102614 A | 6/2019 |
| JP | 2019186530 A | 10/2019 |

\* cited by examiner

LIGHT SOURCE, LIGHT SOURCE DEVICE AND METHOD OF MANUFACTURING LIGHT SOURCE

CROSS-REFERENCE TO RELATED APPLICATION

This application claims priority to Japanese Patent Application No. 2020-198840, filed on Nov. 30, 2020, the disclosure of which is hereby incorporated herein by reference in its entirety.

BACKGROUND

The present disclosure relates to a light source, a light source device, and a method of manufacturing a light source.

Light sources having a plurality of light emitting elements arranged in an array are utilized in a wide range of application areas. Driving a given portion of the plurality of light emitting elements allows such light sources to perform partial irradiation to change the irradiated area. Such characteristics can be utilized to produce a lighting device having features that were unavailable in the past. For example, Japanese Patent Publication No. 2016-219637 discloses a light source applicable to an automotive adaptive front-lighting system.

SUMMARY

The present disclosure provides a light source having good emission characteristics during partial irradiation, such a light source device, and a method of manufacturing the light source.

A light source according to an embodiment of the present disclosure includes a plurality of light emission units and a light shielding member. The light emission units are arranged one-dimensionally or two-dimensionally. At least one of the light emission units includes a light emitting element having a light emission face, a wavelength conversion member disposed on the light emission face, and a light transmissive member disposed on an upper face of the wavelength conversion member. The light transmissive member includes a first region positioned above the light emitting element and a second region positioned outward from the first region in a top view. The second region has a thickness smaller than a thickness of the first region. The wavelength conversion member is larger than the light emission face of the light emitting element in the top view. The light shielding member is continuously disposed between adjacent ones of the light emission units. The light shielding member covers a lateral face of the light emitting element and a lateral face of the wavelength conversion member in the at least one of the light emission units. A lateral face of the light transmissive member in the at least one of the light emission units is at least partially exposed from the light shielding member.

A light source device according to an embodiment of the present disclosure includes the light source described above and a lens mounted at a predetermined distance from the light source. A method of manufacturing a light source according to an embodiment of the present disclosure includes: bonding a plurality of light emitting elements arranged one-dimensionally or two-dimensionally to a wavelength conversion layer of a stacked body so that a light emission face of each of the light emitting elements faces the wavelength conversion layer, the light emitting elements each having the light emission face and an electrode face located opposite to the light emission face, the stacked body including the wavelength conversion layer and a light transmissive layer; forming a first groove in the stacked body from a wavelength conversion layer side in a region between adjacent ones of the light emitting elements to segmentalize the stacked body into a plurality of sets of a wavelength conversion member and a light transmissive member respectively corresponding to each of the light emitting elements; disposing a light shielding member between the adjacent ones of the light emitting elements to cover lateral faces of the adjacent ones of the light emitting elements, lateral faces of the wavelength conversion members, and lateral faces of the light transmissive members; and forming a second groove in faces of the light transmissive members not facing the wavelength conversion members by removing at least a portion of the light shielding member located between adjacent ones of the light transmissive members to expose at least portions of the lateral faces of the adjacent ones of the light transmissive members from the light shielding member.

A method of manufacturing a light source according to another embodiment of the present disclosure includes: bonding a plurality of light emitting elements arranged one-dimensionally or two-dimensionally to a wavelength conversion layer of a stacked body so that a light emission face of each of the light emitting elements faces the wavelength conversion layer, the light emitting elements each having the light emission face and an electrode face located opposite to the light emission face, the stacked body including the wavelength conversion layer and a light transmissive layer; forming a first groove in the stacked body from a wavelength conversion layer side in a region between adjacent ones of the light emitting elements so that the first groove reaches the light transmissive layer to segmentalize the wavelength conversion layer into a plurality of wavelength conversion members respectively corresponding to the light emitting elements; disposing a light shielding member between adjacent ones of the light emitting elements to cover lateral faces of the light emitting elements, lateral faces of the wavelength conversion members, and exposed portions of the light transmissive layer in the first groove; and forming a second groove in the light transmissive layer by partially removing the light transmissive layer from a light transmissive layer side in a region between adjacent ones of the light emitting elements so that the second groove reaches the light shielding member to segmentalize the light transmissive layer into a plurality of light transmissive members respectively positioned on the wavelength conversion members.

According to certain embodiments of the present disclosure, a light source having good emission characteristics during partial irradiation, such a light source device, and a method of manufacturing the light source can be provided.

DETAILED DESCRIPTION

Figure 1:
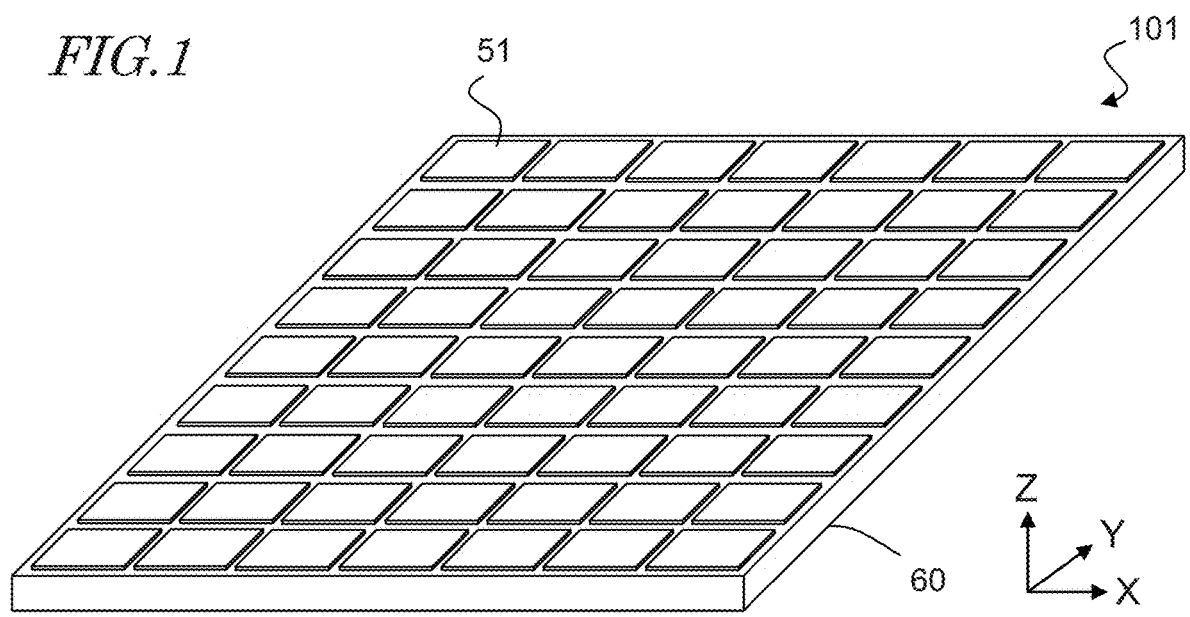
FIG. 1 is a schematic perspective view of a light source according to a first embodiment.

Certain embodiments of the present disclosure will be explained in detail below with reference to the accompanying drawings. The embodiments described below are exemplary, and the light sources, light source device, and the methods of manufacturing the light sources according to the present disclosure are not limited to those described below. For example, the numerical values, shapes, materials, manufacturing steps, and the sequence of the steps described in the embodiments described below are merely examples, and are modifiable in various ways to the extent that such a modification does not cause technical inconsistencies. Each of the embodiments described below is merely exemplary, and various combinations can be made to the extent that such a combination does not cause technical inconsistencies.

The sizes, shapes, and the like of the constituent elements shown in the drawings might be exaggerated for clarity of explanation, and might not reflect the sizes and shapes of, and the relative sizes among the constituent elements in an actual light source. Certain elements might be omitted in a drawing or only a cut end face might be used as a cross-sectional view so as not to make the drawing excessively complex.

In the description below, the constituent elements having practically the same functions are denoted by common reference numerals for which explanation might be omitted. In the description below, terms indicating specific directions or positions (e.g., "upper," "lower," "right," "left" and other terms including or related to these) might be used. These terms, however, are merely used in order to make the relative directions or positions in the drawings being referenced more easily understood. As long as the relationship between relative directions or positions indicated with the terms such as "upper," "lower," or the like is the same as those in a referenced drawing, the layout of the elements in other drawings, or actual products and manufacturing equipment outside of the present disclosure, does not have to be the same as those shown in the referenced drawing. In the present disclosure, being "parallel" includes cases where two straight lines, sides, planes, or the like, form an angle in the range of 0° to about ±5° unless otherwise specifically stated. In the present disclosure, being "perpendicular" or "orthogonal" includes cases where two straight lines, sides, planes, or the like form an angle in the range of from 90° to about ±5° unless otherwise specifically stated. Furthermore, the positional relationships of constituent elements expressed with the term "upper" include cases in which a constituent element is in contact with another, as well as cases in which a constituent element is positioned above another without being in contact.

The drawings referenced below include arrows indicating the x, y, and z axes that are orthogonal to one another. The x direction along the x axis represents a predetermined direction in the plane where the light emission units of the light source according to each embodiment are arranged, i.e., the light emission unit arrangement plane, the direction along the y axis is the direction orthogonal to the x direction in the light emission unit arrangement plane, and the z direction along the z axis is the direction orthogonal to the arrangement plane. The x direction pointed by the arrow represents the +x direction, and the direction opposite the +x direction represents the −x direction. The y direction pointed by the arrow represents the +y direction, and the direction opposite the +y direction represents the −y direction. The z direction pointed by the arrow represents the +z direction, and the direction opposite the +z direction represents the −z direction. In each embodiment, the light source, as an example, outputs light in the +z direction. This, however, is not intended to restrict the orientation of the light source or the light source device in use, and the light source and the light source device can be oriented in any way.

First Embodiment

Structure of Light Source 101

Figure 2A:
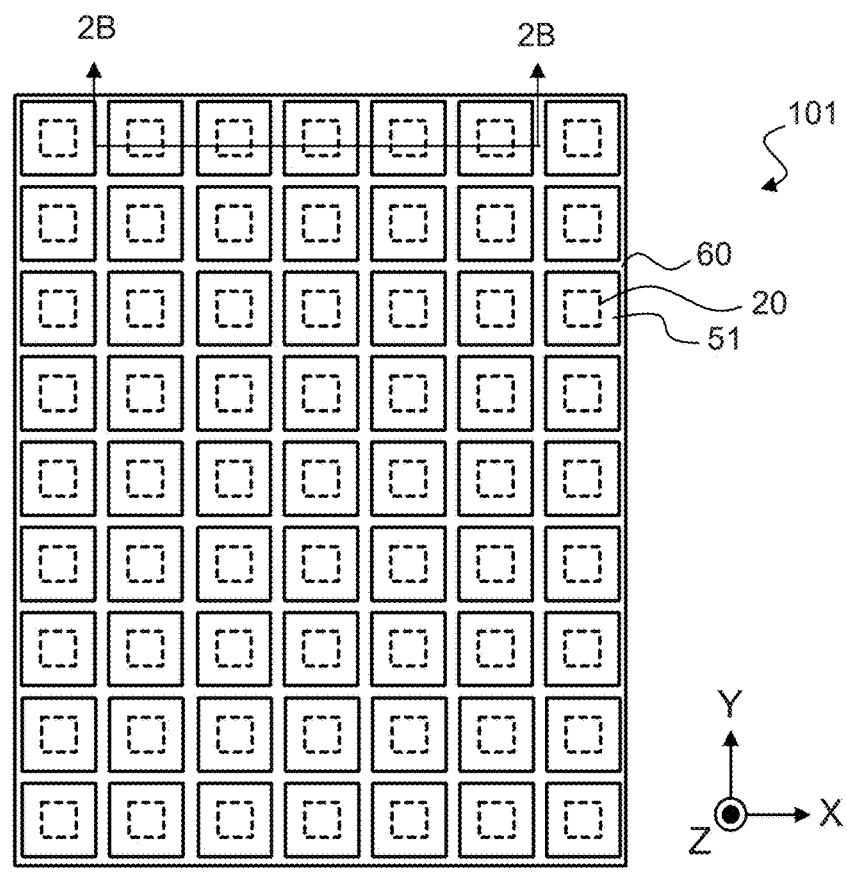
FIG. 2A is a schematic top view of the light source shown in FIG. 1.
Figure 2B:
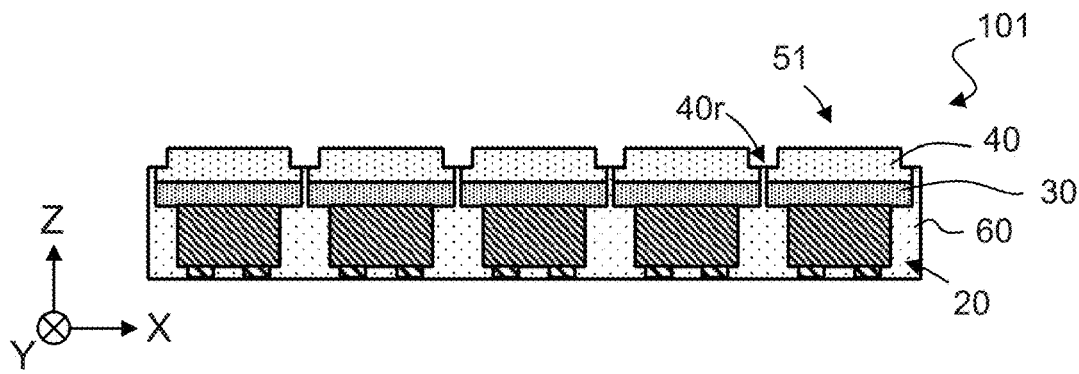
FIG. 2B is a schematic cross-sectional view of the light source taken along line 2B-2B in FIG. 2A.

FIG. 1 is a schematic perspective view of a light source 101 according to a first embodiment, FIG. 2A is a schematic top view of the light source 101, and FIG. 2B is a schematic cross-sectional view of the light source 101 taken along line 2B-2B in FIG. 2A. The light source 101 includes a plurality of light emission units 51 and a light shielding member 60.

The light emission units 51 are one- or two-dimensionally arranged. As used herein, the light emission units 51 are one-dimensionally arranged when all the light emission units 51 are aligned along a single row or column, while the light emission units 51 are two-dimensionally arranged when the light emission units 51 are arranged in rows and columns. For example, as shown in FIG. 2, the light emission units 51 are two-dimensionally arranged in the x direction and the y direction. In this embodiment, the light source 101 includes 63 light emission units 51 arranged in the x and y directions, 7 rows by 9 columns. The number of light emission units 51 to be included in the light source 101 is optional, and can be any other number, for example, about 9 to about 400 units arranged 3 rows by 3 columns to 20 rows by 20 columns.

A light emission unit 51 has, for example, a square or rectangular shape in a top view, i.e., in the x-y plane, each side being 100 µm to 500 µm, preferably 200 µm to 400 µm. The light source 101 has, for example, a square or rectangular shape in the x-y plane, each side being 1 mm to 5 mm, preferably 2 mm to 3 mm. The light source 101 is about 100 µm to about 1 mm in thickness, for example. The size and the number of light emission units 51, and the size of the light source 101 can be determined in accordance with the application. For example, the light source 101 can be used as a photographic flash or video lighting of portable devices such as a smartphone or the like.

Figure 2C:
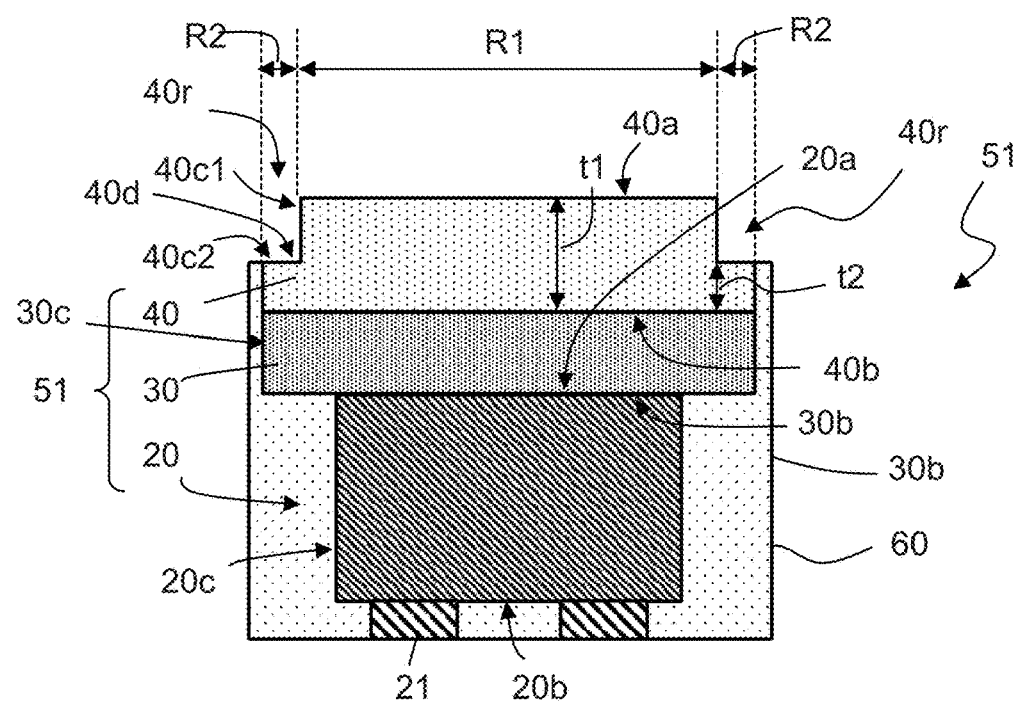
FIG. 2C is a schematic cross-sectional view of a light emission unit.
Figure 2D:
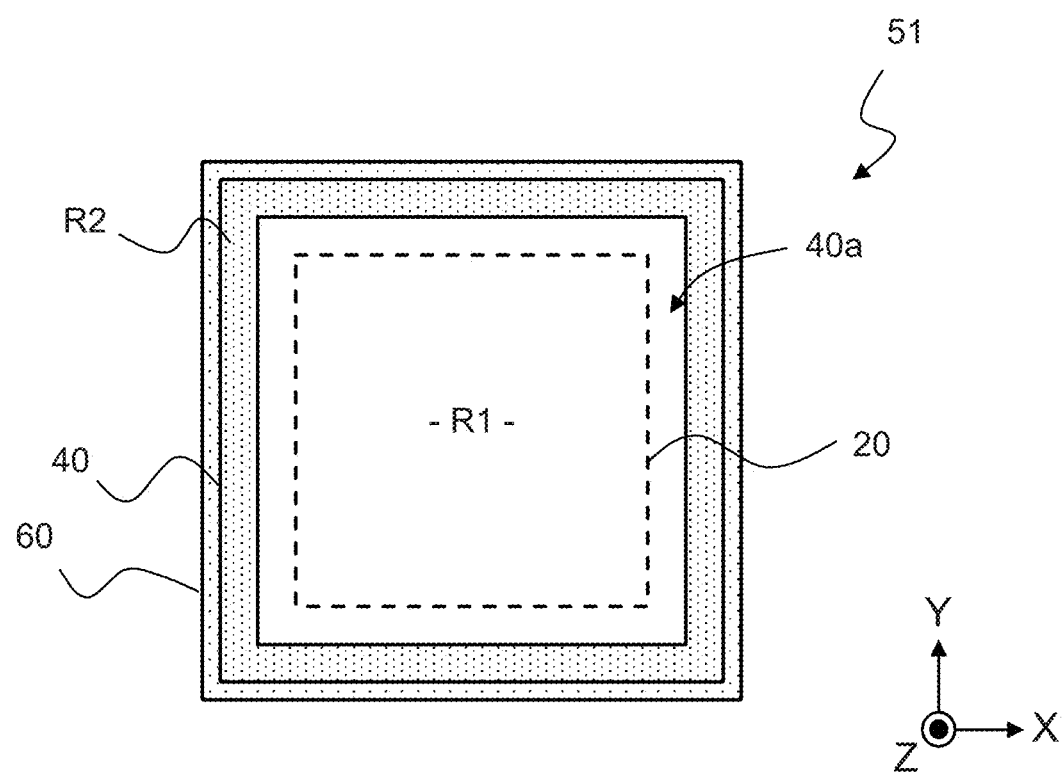
FIG. 2D is a schematic top view of the light emission unit.

FIG. 2C is a schematic cross-sectional view of a light emission unit 51. FIG. 2D is a schematic top view of the light emission unit 51. Each light emission unit 51 includes a light emitting element 20 having a light emission face 20a, a wavelength conversion member 30 disposed on the light emission face 20a, and a light transmissive member 40 disposed on the upper face 30a of the wavelength conversion member 30. In this embodiment, e light emission faces 20a of the light emitting elements 20 are equal in size. A light shielding member 60 is provided continuously between the light emission units 51 to cover the lateral faces 20c of the light emitting elements 20 and the lateral faces 30c of the wavelength conversion members 30. At least a part of the lateral faces of the light transmissive member of each light emission unit is exposed from the light shielding member 60. The structure of a light emission unit 51 will be explained in more detail element by element.

Light Emitting Element 20

A light emitting element 20 has a light emission face 20a, an electrode face 20b, and lateral faces 20c. On the electrode face 20b, positive and negative electrodes 21 are positioned.

The light emitting element 20 is a semiconductor light emitting element, such as a laser diode (LD), light emitting diode (LED), or the like. The light emitting element 20 is typically a LED. The light emitting element 20 includes, for example, a sapphire or gallium nitride support substrate, and a semiconductor stacked body on the support substrate. The semiconductor stacked body includes an n-type semiconductor layer, a p-type semiconductor layer, an active layer interposed between these two layers, and p-side and n-side electrodes electrically connected to the n-type and p-type semiconductor layers. The semiconductor stacked body may include a nitride semiconductor ($In_xAl_yGa_{1-x-y}N$, $0 \le x$, $0 \le y$, $x+y \le 1$) capable of emitting light in the ultraviolet to visible spectra. The positive and negative electrodes 21 are electrically connected to the p-side and the n-side electrodes.

The light emitting element 20 may be a blue light emitting element, or a light emitting element emitting light of another color, such as red, green, or ultraviolet. In this embodiment, blue light emitting LED is illustrated as the light emitting element 20 in each light emission unit 51.

The shape of the upper face, the light emission face 20a, of a light emitting element 20 is typically quadrangular. The length of a side of the quadrangular light emission face 20a is preferably smaller than the length of the corresponding side of the light emission unit 51 in a top view. For example, the length of a side of the quadrangular light emitting element 20 is 50 µm to 300 µm.

Wavelength Conversion Member 30

A wavelength conversion member 30 is disposed on the light emission face 20a of each light emitting element 20. The wavelength conversion member 30 absorbs a portion of the light exiting the light emission face 20a of the light emitting element 20 and emits light having a longer wavelength than that of the absorbed light.

In a top view, the wavelength conversion member 30 is preferably larger than the light emission face 20a of the light emitting element 20. This allows a larger area than the light emission face 20a of the light emitting element 20 to output wavelength-converted light (e.g., white light). This can reduce the generation of low luminance regions between the light emission units 51 when multiple light emission units 51 are lit, even in the case in which the light emitting elements 20 cannot be arranged at sufficiently small intervals in the light source 101.

Each wavelength conversion member 30 includes, for example, a light transmissive resin and a phosphor. For the phosphor, for example, yttrium aluminum garnet based phosphors (e.g., $Y_3(Al,Ga)_5O_{12}:Ce$), lutetium aluminum garnet based phosphors (e.g., $Lu_3(Al,Ga)_5O_{12}:Ce$), terbium aluminum garnet based phosphors (e.g., $Tb_3(Al,Ga)_5O_{12}:Ce$), β-SiAlON phosphors (e.g., $Si,Al)_3(ON)_4:Eu$), α-SiAlON phosphors (e.g., $M_z(Si,Al)_{12}(O,N)_{16}$ ($0<z \le 2$, and M is Li, Mg, Ca, Y, and lanthanide elements excluding La and Ce), nitride based phosphors, such as CASN-based phosphors (e.g., $CaAlSiN_3:Eu$) or SCASN based phosphors (e.g., $(Sr,Ca)AlSiN_3:Eu$), fluoride based phosphors, such as KSF based phosphors (e.g., $K_2SiF_6:Mn$) or MGF based phosphors (e.g., $3.5MgO.0.5MgF_2.GeO_2:Mn$), perovskite, chalcopyrite, or quantum dot phosphors can be used.

For the light transmissive resin, a silicone resin, modified silicone resin, epoxy resin, modified epoxy resin, acrylic resin, or fluorine resin can be used. A blend of these resins may alternatively be used.

The wavelength conversion member 30 may include several types of phosphors, for example, a phosphor that absorbs blue light and emits yellow light and a phosphor that absorbs blue light and emits red light. This allows the light emission unit 51 to emit desired white light.

The wavelength conversion members 30 may contain a light diffusing material to the extent that it does not block light. The light diffusing material content in the wavelength conversion members 30 can be adjusted such that the transmittance of the wavelength conversion members 30 with respect to the light exiting the light emitting elements 20 and/or the wavelength-converted light is 50% to 99%, preferably 70% to 90%. For the light diffusing material, for example, titanium oxide, silicon oxide, aluminum oxide, zinc oxide, or glass can be used.

For the wavelength conversion members 30, glass containing a phosphor may be used. Alternatively, the wavelength conversion members may be a sintered body composed only of a phosphor, or a sintered body which includes a phosphor and any of the light diffusing materials described above.

Light Transmissive Member 40

A light transmissive member 40 is provided on the upper face 30a of each wavelength conversion member 30, covering the upper face 30a. The light transmissive member 40 constitutes the light emission face of a light emission unit 51. The light transmissive member 40 can reduce the luminance nonuniformity of the light exiting the wavelength conversion member 30.

Each light transmissive member 40 has an upper face 40a and a lower face 40b located opposite to the upper face 40a. The light transmissive member 40, when the upper face 40a is viewed from above, has a first region R1 positioned above a light emitting element 20, and a second region R2 positioned outward from the first region R1. In this embodiment, the area of the first region R1 is larger than the area of the light emission face 20a of the light emitting element 20, but the area of the first region R1 may be the same as the area of the light emission face 20a. In FIG. 2D, for the sake of clarity, no hatching is applied to the first region R1, but the same hatching patterns as those in FIG. 2C are applied to the second region R2 and the light shielding member 60. As shown in FIG. 2D, the second region R2 surrounds the first region R1.

In each light transmissive member 40, the first region R1 is larger in thickness than the second region. In other words, the thickness t2 of the second region R2 is smaller than the thickness t1 of the first region R1. In this embodiment, a recessed portion 40r (i.e., second groove 162 described later) is created in the peripheral portion of each light transmissive member 40 in the upper face of the light source 101, whereby a second region R2 is formed in each light transmissive member 40. The creation of a recessed portion 40r makes the area of the upper face 40a smaller than the lower face 40b.

Each light transmissive member 40 has lateral faces positioned between the upper face 40a and the lower face 40b. The lateral faces each have a first lateral face 40c1 and a second lateral face 40c2 in the height direction of the light transmissive member 40. The first lateral face 40c1 and the second lateral face 40c2 are defined by the recessed portion 40r. Each light transmissive member 40 may have an intermediary face 40d between the first lateral face 40c1 and the second lateral face 40c2 which is substantially parallel to the upper face 40a and the lower face 40b.

The first lateral face 40c1 is the lateral face of the recessed portion 40r, and is contiguous with the upper face 40a. The second lateral face 40c2 is contiguous with the lower face 40b. The intermediary face 40d is the bottom face of the recessed portion 40r. As described later, the first lateral face 40c1 is exposed from the light shielding member 60, but the second lateral faces 40c2 are covered by the light shielding member 60. In other words, each light transmissive member 40 is constructed such that the recessed portion 40r created exposes at least some portions of the lateral faces from the light shielding member 60.

The light transmissive members 40 can be constructed by using a similar resin to the light transmissive resin used for the wavelength conversion members 30. The light transmissive members 40 can be formed of glass or a ceramic having light transmissivity.

The light transmissive members 40 preferably contain a light diffusing material. For the light diffusing material, the same or a similar material to the light diffusing material that can be added to the wavelength conversion members 30 can be used.

Light Shielding Member 60

A light shielding member 60 is continuously disposed between the light emission units 51 while covering the lateral faces 20c of the light emitting elements 20 and the lateral faces 30c of the wavelength conversion members 30 in each light emission unit 51. The light shielding member 60 has light shielding properties or light reflectivity. By covering at least these lateral faces, the light shielding member 60 can hinder the light exiting the lateral faces 20c of the light emitting element 20 and the lateral faces 30c of the wavelength conversion member 30 in each light emission unit 51 from entering any adjacent light emission unit 51.

In this embodiment, the light shielding member 60 extends from the lateral faces of the light emitting elements 20 to cover the electrode faces 20b of the light emitting elements 20. However, the surfaces of the electrodes 21 on the electrode faces 20b are exposed from the light shielding member 60. Because the wavelength conversion members 30 are larger than the light emission faces 20a of the light emitting elements 20, the areas of the lower faces 30b not in contact with the light emission faces 20a are covered by the light shielding member 60. The light shielding member 60 also covers the second lateral faces 40c2 of the light transmissive members 40.

The reflectance of the light shielding member 60 is preferably 20% to 95%, for example, more preferably 50% to 95%. The light shielding member 60, for example, includes a light diffusing material and a resin material. For the resin material and the light diffusing material, a light transmissive resin and a light diffusing material similar to those used for the wavelength conversion members 30 can be used. The light shielding member may contain a light absorbing material such as carbon black in addition to the light diffusing material.

Operation of Light Source 101

In a light source 101, the light exiting the light emission faces 20a of the light emitting elements 20 passes through the wavelength conversion members 30 and the light transmissive members 40 before exiting the light source. At this time, the wavelength of at least a portion of the light from the light emitting elements 20 is converted by the wavelength conversion members 30. The light externally output includes the light which has exited the light emitting elements 20 and the wavelength-converted light. For example, in the case in which the light emitting elements 20 emit blue light and the wavelength conversion members 30 contain at least a yellow-emitting phosphor, the light source 101 emits white light resulting from mixing the blue light and the yellow light.

The light source 101 structured as above has good emission characteristics during partial irradiation. Specifically, because the wavelength conversion members 30 are larger than the light emission faces 20a of the light emitting elements 20 in a top view, the light source can output white light through larger areas than the light emission faces 20a of the light emitting elements 20. This can reduce the generation of low luminance regions between the light emission units 51 when multiple light emission units 51 are lit, even in the case in which the light emitting elements 20 cannot be arranged at sufficiently small intervals.

Furthermore, the distance between the wavelength conversion members 30 in two adjacent light emission units 51 is smaller than the distance between the corresponding light emitting elements 20. In the light source 101, a light shielding member 60 is disposed between the facing lateral faces of the light emitting elements 20 and the facing lateral faces 30c of the wavelength conversion members 30 of adjacent light emission units 51. This can hinder the light from the light emitting element 20 in each light emission unit 51 from entering the wavelength conversion members 30 of any adjacent light emission unit 51, as well as reducing the propagation of light between adjacent wavelength conversion members 30. This can reduce the leakage of light along the boundary between a lit light emission unit 51 and an unlit light emission unit 51.

Each light transmissive member 40 includes a first region R1 positioned above the light emitting element 20 and a second region R2 located on the outside of the first region R1. In each light transmissive member 40, as compared to the first region R1 located immediately above the light emitting element 20 in which the luminance is relatively high, a smaller thickness is given to the second region R2 located in the periphery of the first region R1 and having low luminance. Accordingly, allowing the light transmissive members 40 to contain a light diffusing material can reduce the absorption and diffusion of light by the second region R2 as compared to the first region R1 of each light transmissive member 40, thereby enhancing the luminance uniformity of the light exiting the light transmissive members 40.

The light transmissive members 40 have the first lateral faces 40c1 that are not covered by the light shielding member 60. In other words, between two adjacent light emission units 51 in the light source 101, the first lateral faces 40c1 of the light transmissive members 40 face one another without interposing a light shielding member 60. This allows the light to laterally exit the first lateral faces 40c1 of the light transmissive members 40, thereby lessening the luminance decline along the boundary between two adjacent light emission units 51. This can reduce the generation of a dark line between two adjacent light emission units 51 when both are lit.

Method of Manufacturing Light Source 101

Figure 3:
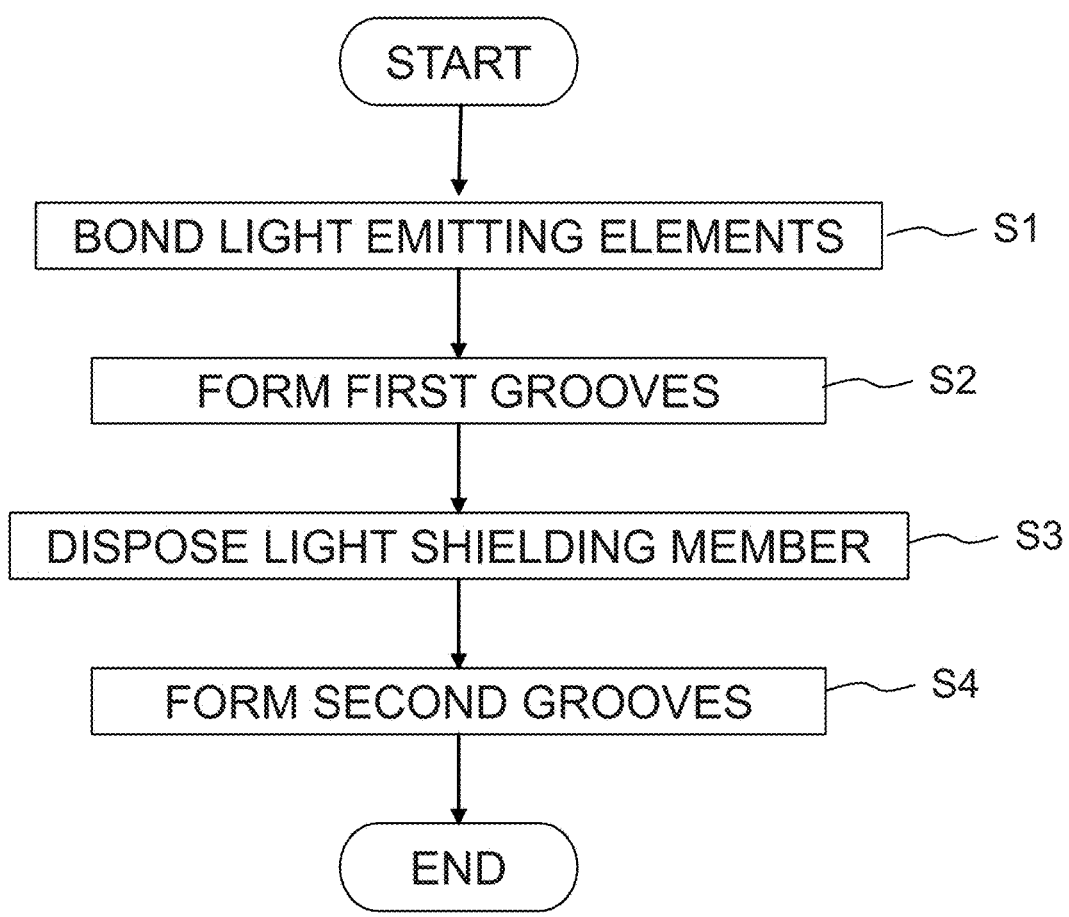
FIG. 3 is a flowchart showing a method of manufacturing the light source according to the first embodiment.

One embodiment of a method of manufacturing a light source 101 will be explained. FIG. 3 is a flowchart of an example of a method of manufacturing a light source 101, and FIGS. 4A to 4K are cross-sectional views each showing a process in the method of manufacturing a light source 101 shown in FIG. 3. The method of manufacturing a light source 101 according to this embodiment includes at least, a light emitting element bonding step (S1), a first groove forming step (S2), a light shielding member disposing step (S3), and a second groove forming step (S4).

Light Emitting Element Bonding Step (S1)

Figure 4A:
FIG. 4A is a cross-sectional view showing a process in the method of manufacturing the light source according to the first embodiment.

As shown in FIG. 4A, a light transmissive layer 140 which is a monolithic body of light transmissive members and a wavelength conversion layer 130 which is a monolithic body of wavelength conversion members are adhered by using an adhesive or an adhesive sheet to obtain a stacked body 150. The light transmissive layer 140 and the wavelength conversion layer 130 may have the size that corresponds to a light source 101, or a size for producing multiple light sources 101. The light transmissive layer 140 of the stacked body 150 is temporality fixed to a support 120.

Figure 4B:
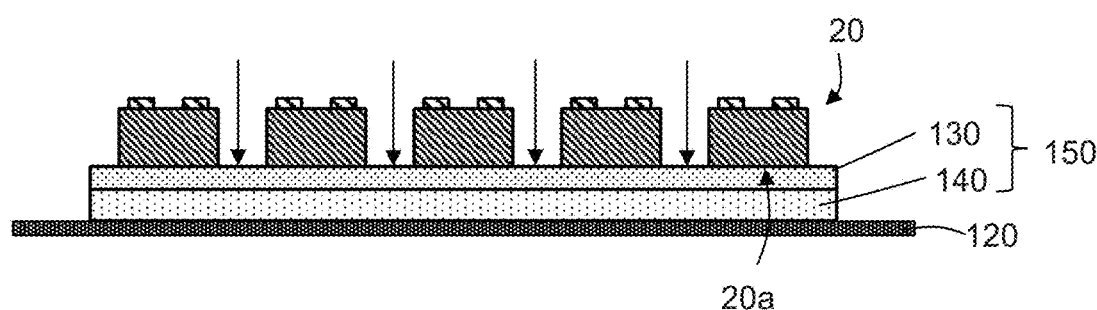
FIG. 4B is a cross-sectional view showing a process in the method of manufacturing the light source according to the first embodiment.

As shown in FIG. 4B, a plurality of light emitting elements 20 are bonded to the stacked body 150. The light emitting elements 120 are arranged and bonded to the wavelength conversion layer 130 while allowing the light emission faces 20a of the light emitting elements 20 to face the wavelength conversion layer 130. By disposing an adhesive or adhesive sheet on the surface of the wavelength conversion layer 130 or the light emission faces 20a of the light emitting elements 20 in advance, the light emitting elements 20 can be bonded to the wavelength conversion layer 130 via the adhesive material. The light emitting elements 20 are one- or two-dimensionally arranged using the pitch used for the light emission units 51 in the light source 101.

The bonding between the light transmissive layer 140 and the wavelength conversion layer 130, and between the wavelength conversion layer 130 and the light emitting elements 20 may be done directly without interposing any adhesive material by utilizing the tackiness of the light transmissive layer 140 and the wavelength conversion layer 130.

First Groove Forming Step (S2)

Figure 4C:
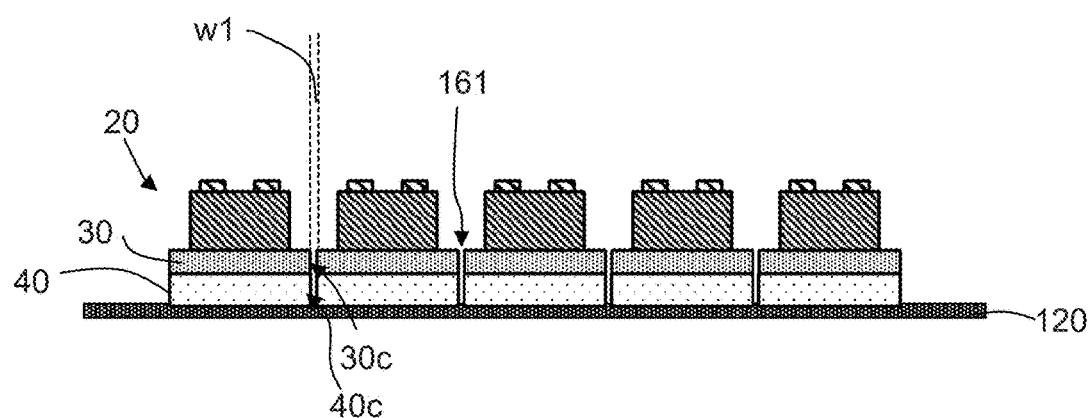
FIG. 4C is a cross-sectional view showing a process in the method of manufacturing the light source according to the first embodiment.

As shown in FIG. 4C, first grooves 161 which segmentize the stacked body 150 are formed between adjacent light emitting elements 20. By applying a dicing saw blade or the like at the positions of the stacked body 150 indicated by the arrows in FIG. 4B, the first grooves 161 as shown in FIG. 4C having a width w1 are formed in the stacked body 150 by cutting from the wavelength conversion layer 130 side. This provides each light emitting element 20 with a wavelength conversion member 30 and a light transmissive member 40. The lateral faces 30c of the wavelength conversion members 30 and the lateral faces 40c of the light transmissive members 40 are exposed at the lateral faces defining the first grooves 161.

In this process, the first grooves 161 do not have to completely segmentalize the stacked body 150. It is sufficient for the first grooves to completely segmentalize at least the wavelength conversion layer 130 and reach the light transmissive layer 140. The light transmissive layer 140 may be partially removed or not removed at all by the first grooves 161.

Light Shielding Member Disposing Step (S3)

Figure 4D:
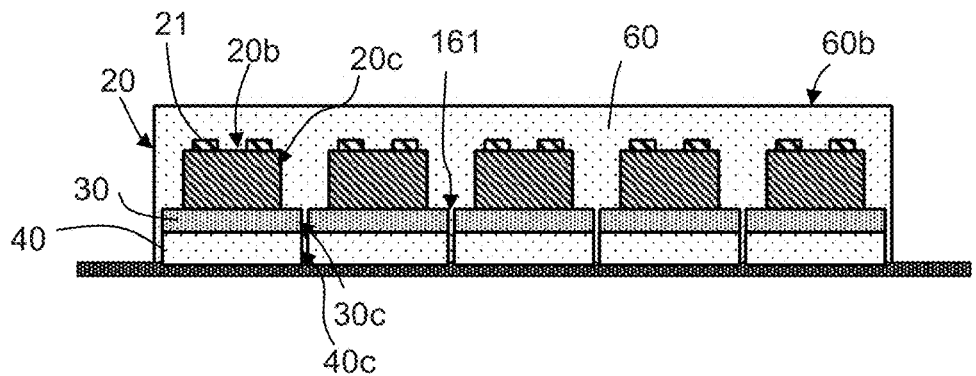
FIG. 4D is a cross-sectional view showing a process in the method of manufacturing the light source according to the first embodiment.

As shown in FIG. 4D, a light shielding member 60 is disposed between the light emitting elements 20. Specifically, the light shielding member 60 is disposed to cover the lateral faces 30c of the wavelength conversion members 30 and the lateral faces 40c of the light transmissive members 40 exposed at the lateral faces defining the first grooves 161 and the lateral faces 20c of the light emitting elements 20. In this embodiment, the light shielding member 60 is disposed to cover the electrode faces 20b and the electrodes 21 on the electrode face 20b of the light emitting elements 20. The light shielding member 60 can be formed, for example, by transfer molding, potting, printing, spraying, or the like.

Figure 4E:
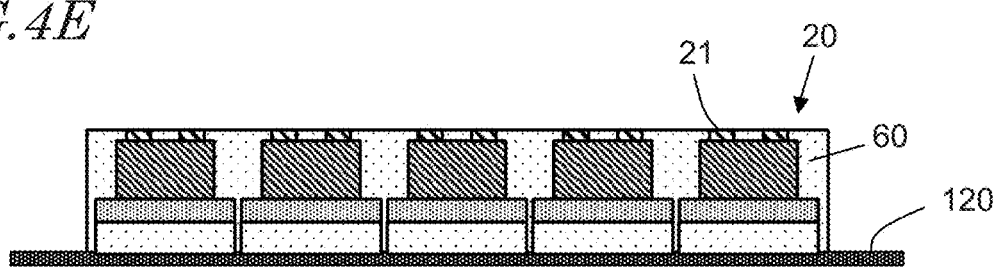
FIG. 4E is a cross-sectional view showing a process in the method of manufacturing the light source according to the first embodiment.

As shown in FIG. 4E, the surfaces of the electrodes 21 of the light emitting elements 20 are exposed by grinding or cutting off a portion of the light shielding member 60 from the upper face 60b.

Second Groove Forming Step (S4)

Figure 4F:
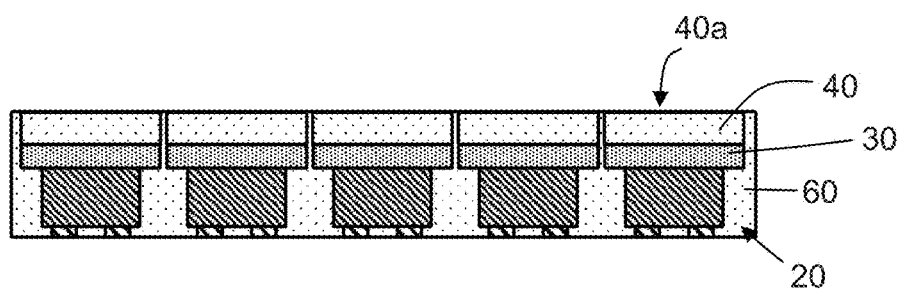
FIG. 4F is a cross-sectional view showing a process in the method of manufacturing the light source according to the first embodiment.
Figure 4G:
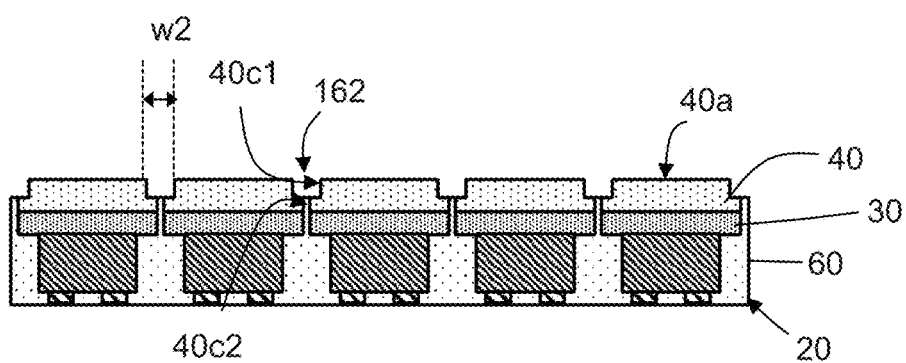
FIG. 4G is a cross-sectional view showing a process in the method of manufacturing the light source according to the first embodiment.

As shown in FIG. 4F, the support 120 is removed from the light transmissive members 40 to expose the upper faces 40a of the light transmissive members 40 located opposite to the faces in contact with the wavelength conversion members 30. As shown in FIG. 4G, second grooves 162 that expose some portions of the lateral faces of the light transmissive members 40 from the light shielding member 60 are formed by removing from the upper face 40a side the outer edge portions of the light shielding member 60 located between the light transmissive members 40. The second grooves 162 can be formed by using a blade, such as a dicing saw.

In this embodiment, because the second grooves 162 each have a larger width w2 than the width w1 of the first grooves 161, the outer edge portions of the light transmissive members 40 facing one another via the light shielding member 60 are also made absent by the second grooves 162. The second grooves 162 which do not reach the wavelength conversion members 30 have a depth of about one half of the thickness of the light transmissive members 40. In the case in which the stacked body 150 is not completely segmentalized by the first grooves 161 formed during the first groove forming step, the second grooves 162 are formed to the depth to reach the first grooves 161.

Figure 5A:
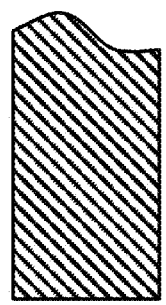
FIG. 5A is a schematic cross-sectional view of the tip of a blade used to form a first or second groove.

The cross-sectional shape of a second groove 162 reflects the cross-sectional shape of the blade used to form the second groove 162. In this embodiment, the tip of a blade having a rectangular cross-sectional shape as shown in FIG. 5A forms the first lateral faces 40c1 that are perpendicular to the upper faces 40a. Forming the second grooves 162 provides the light transmissive members 40 with the first lateral faces 40c1 exposed from the light shielding member 60 and the second lateral faces 40c2 covered by the light shielding member 60.

The light source 101 is completed in this manner. In the case in which the light transmissive layer 140 and the wavelength conversion layer 130 have the size that corresponds to multiple light sources 101, the multiple light sources 101 are linked by the light shielding member 60. Accordingly, the light sources 101 are completed after cutting the light shielding member 60 along the boundaries of the light sources 101.

Other Forms

Various modifications can be made to the light source according to the present disclosure. As described above, the shape of the first lateral faces of the light transmissive member 40 of each light emission unit 51 can be changed by using a blade having a different tip in forming the second grooves 162.

Figure 5B:
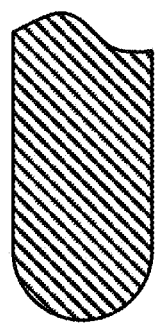
FIG. 5B is a schematic cross-sectional view of the tip of a blade used to form a first or second groove.
Figure 6A:
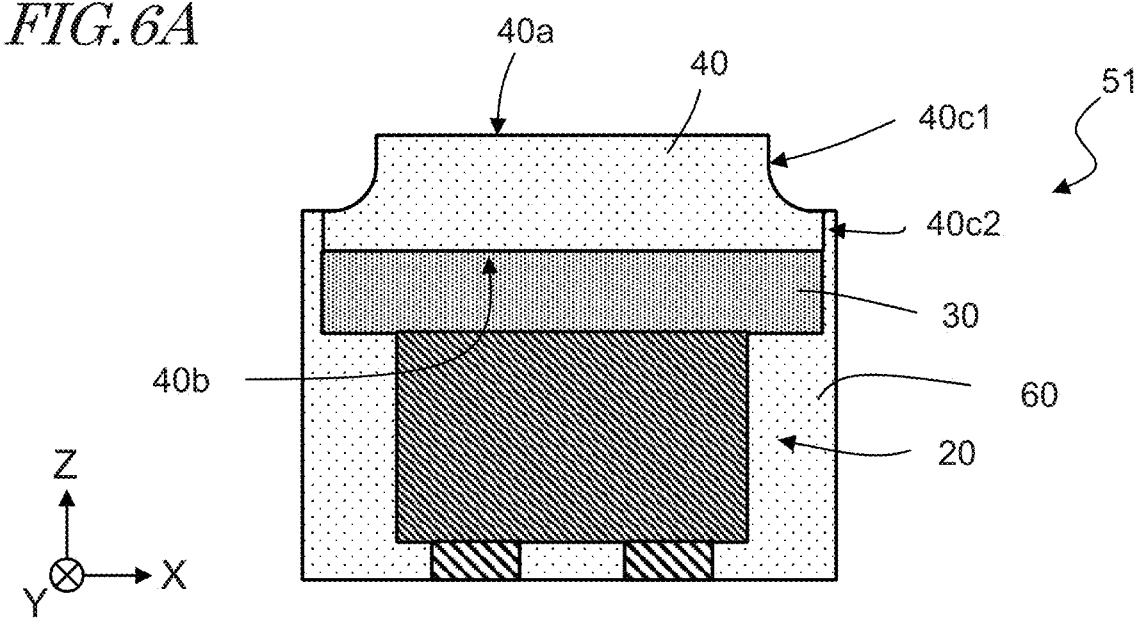
FIG. 6A is a schematic cross-sectional view of another form of a light emission unit.

In the case of forming the second grooves 162 using a blade having a tip that has a U-shaped or curved line cross section as shown in FIG. 5B, the first lateral faces 40c1 of a light transmissive member 40 each have a curved portion as shown in FIG. 6A. The second lateral faces 40c2, similar to FIG. 2C, are planar because the second lateral faces 40c2 are formed by the first grooves 161.

Figure 5C:
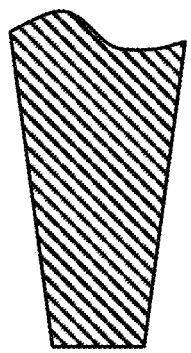
FIG. 5C is a schematic cross-sectional view of the tip of a blade used to form a first or second groove.
Figure 6B:
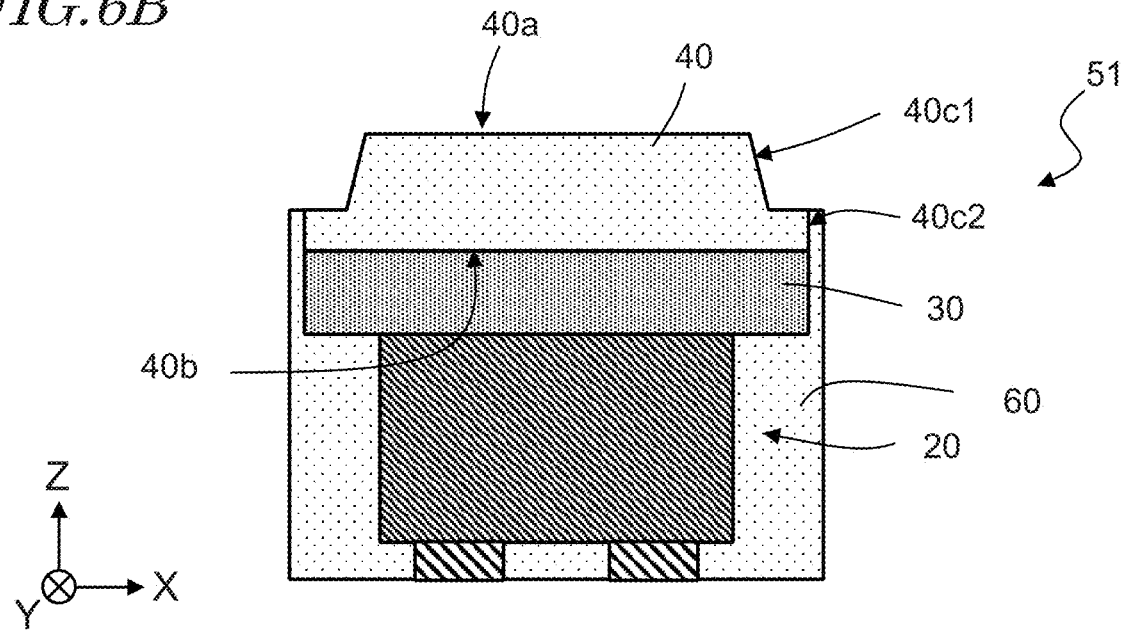
FIG. 6B is a schematic cross-sectional view of another form of a light emission unit.

In the case of forming the second grooves 162 using a blade having a tip that has a trapezoidal cross section as shown in FIG. 5C, the first lateral faces 40c1 of the light transmissive member 40 are oblique to the vertical direction as shown in FIG. 6B.

As described above, the direction of the light exiting the first lateral faces 40c1 can be altered by changing the shape or the inclination of the first lateral faces 40c1. This can adjust the distribution of the light laterally exiting the light emission units 51.

Figure 7A:
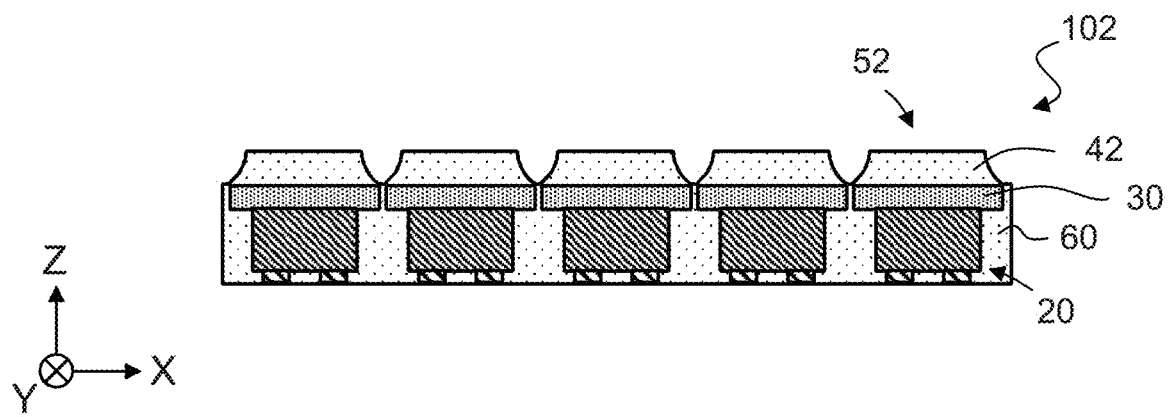
FIG. 7A is a schematic cross-sectional view of another form of a light source.
Figure 7B:
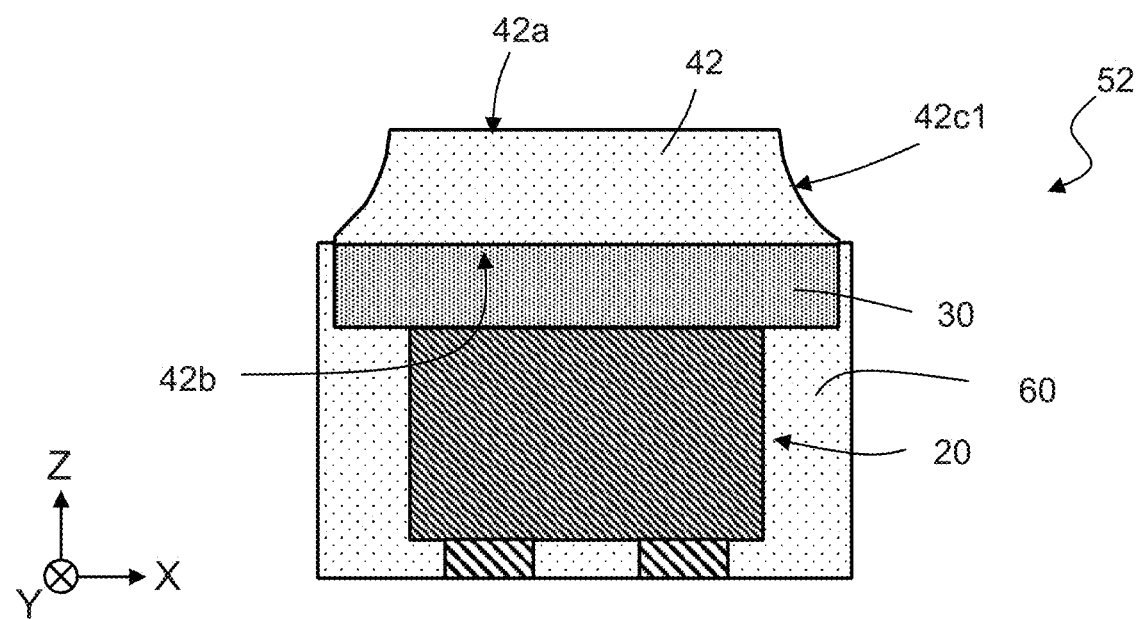
FIG. 7B is a schematic cross-sectional view of a light emission unit the light source shown in FIG. 7A.
Figure 7C:
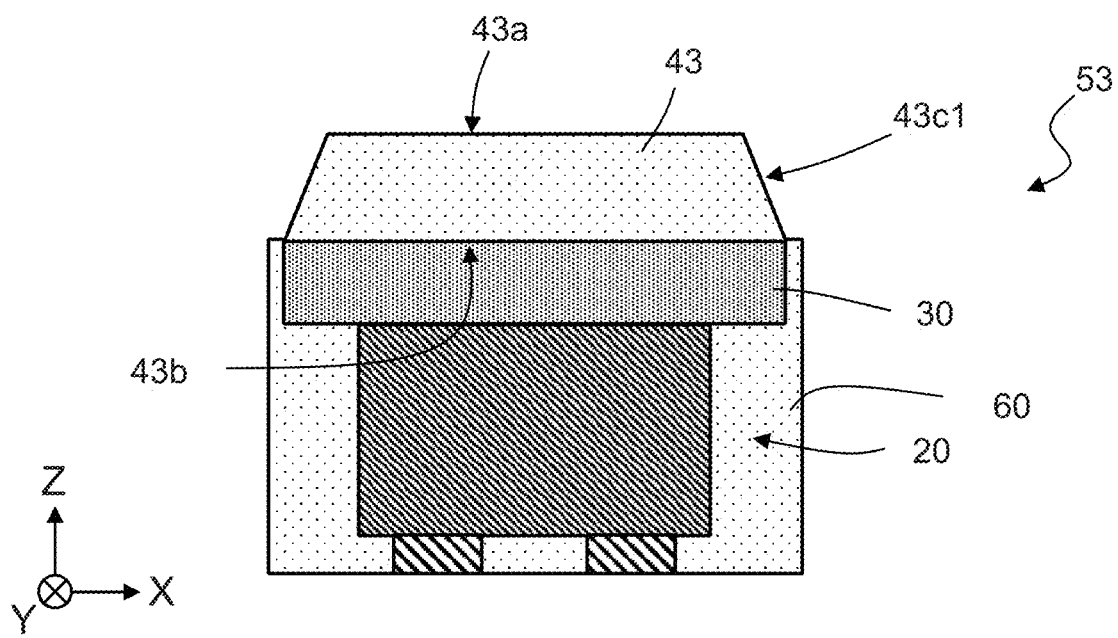
FIG. 7C is a schematic cross-sectional view of another form of a light emission unit.

FIGS. 7A and 7B show an example of a light source 102 having light transmissive members in another form. As shown in FIGS. 7A and 7B, the light source 102 differs from the light source 101 shown in FIGS. 2A and 2B in that each light emission unit 52 has a light transmissive member that has no second lateral faces. In each light emission unit 52 of the light source 102, the first lateral faces 41c1 of the light transmissive member 42 are contiguous with the upper face 40a and the lower face 40b without any second lateral face. In other words, the lateral faces of the light transmissive member 42 of each light emission unit 52 of the light source 102 are entirely exposed from the light shielding member 60. The first lateral faces 42c1 each have a curved face portion. The light source 102 including the light transmissive members 42 with such a shape can be produced by forming second grooves 162 that reach the wavelength conversion members 30 by using a blade having the cross-sectional shape shown in FIG. 5B. Similarly, a light source 103 including the light transmissive member 43 shown in FIG. 7C can be produced by forming second grooves 162 that reach the wavelength conversion member 30 using a blade having the cross-sectional shape shown in FIG. 5C. The light transmissive member 43 has planar first lateral faces 43c1 oblique to the vertical direction.

Second Embodiment

Figure 8A:
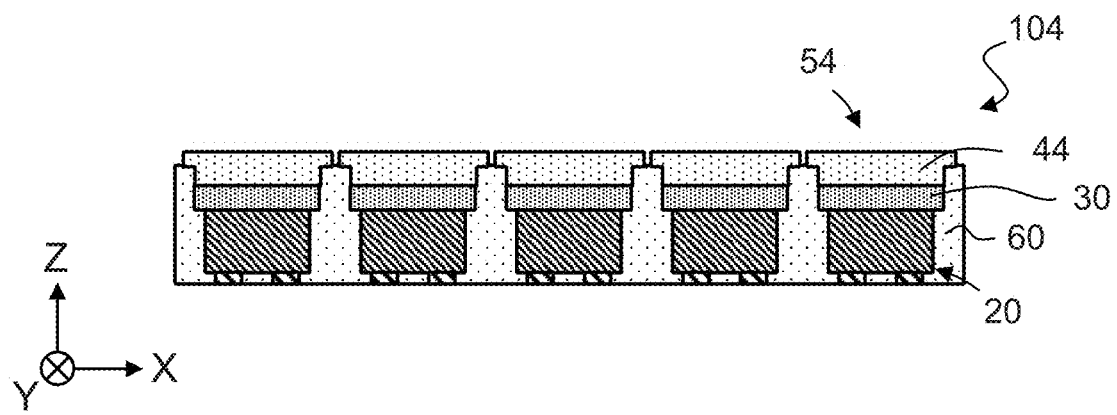
FIG. 8A is a schematic cross-sectional view of a light source according to a second embodiment.
Figure 8B:
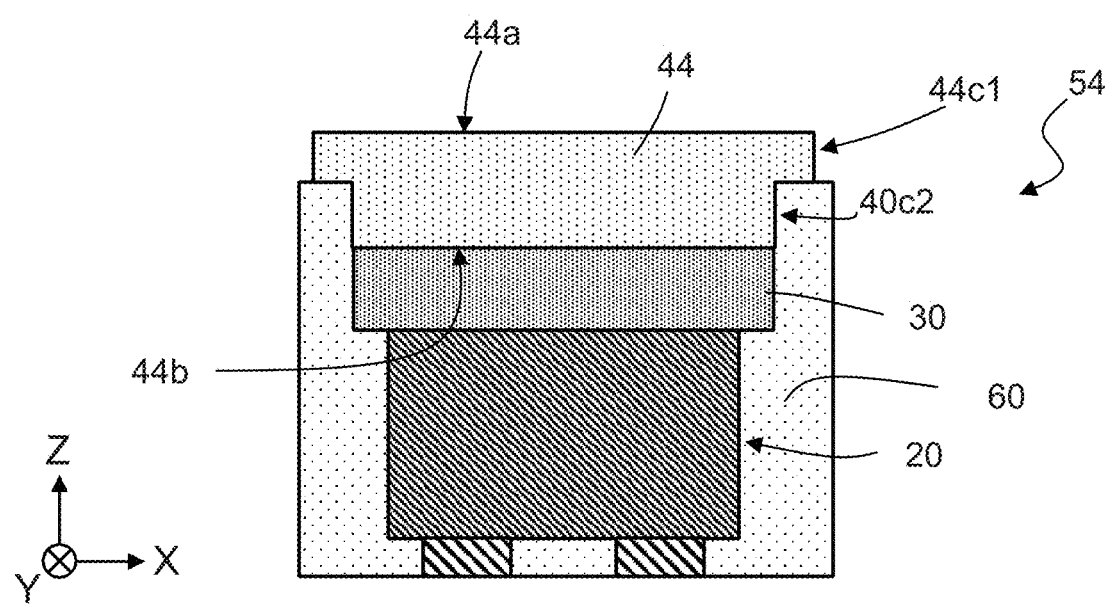
FIG. 8B is a schematic cross-sectional view of a light emission unit according to the second embodiment.

FIG. 8A is a schematic cross-sectional view of a light source 104 according to a second embodiment, and FIG. 8B is a schematic cross-sectional view of a light emission unit 54. The light source 104 differs from the light source 101 of the first embodiment such that the area of the upper face 44a is larger than the lower face 44b of the light transmissive member 44 in each light emission unit 54. Similar to the first embodiment, the thickness of the second region R2 is smaller than the first region R1 in the light transmissive member 44. The first lateral faces 44c1 are exposed from the light shielding member 60, and the second lateral faces 44c2 are covered by the light shielding member 60. The light source 104 exhibits a similar effect to that achieved by the first embodiment.

Figure 9A:
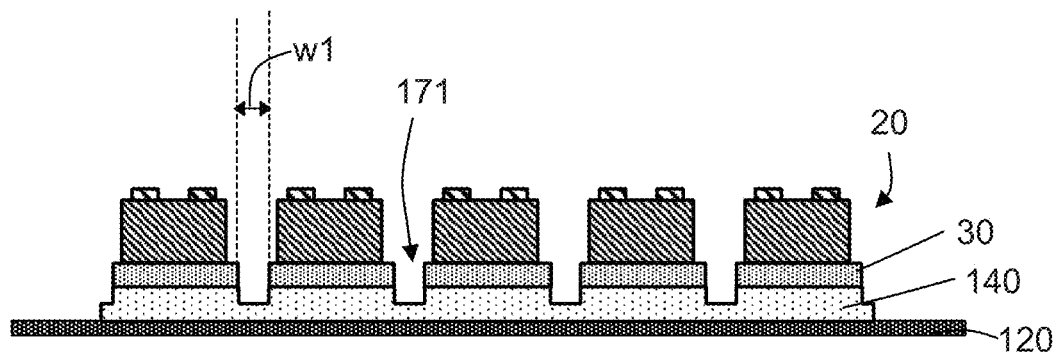
FIG. 9A is a schematic cross-sectional view showing a process in a method of manufacturing the light source according to the second embodiment.

The light source 104 can be manufactured by modifying the steps of forming the first grooves 161 and the second groves 162 in the method of manufacturing a light source according to the first embodiment. Specifically, as shown in FIG. 9A, first grooves 171 that reach the light transmissive layer 140 are formed by segmentalizing the wavelength conversion layer 130 between the light emitting elements 20 from the wavelength conversion layer 130 side. The width w1 of the first grooves 171 is set larger than the width w1 of the first grooves 161 of the first embodiment. The first grooves 171 are formed so as not to reach the support 120. In other words, the light transmissive layer 140 is not segmentalized by the first grooves 171. Forming the first grooves 171 segmentalizes the wavelength conversion layer 130, providing each light emission unit 54 with a wavelength conversion member 30. A light shielding member 60 is disposed in the first grooves 171.

Figure 9B:
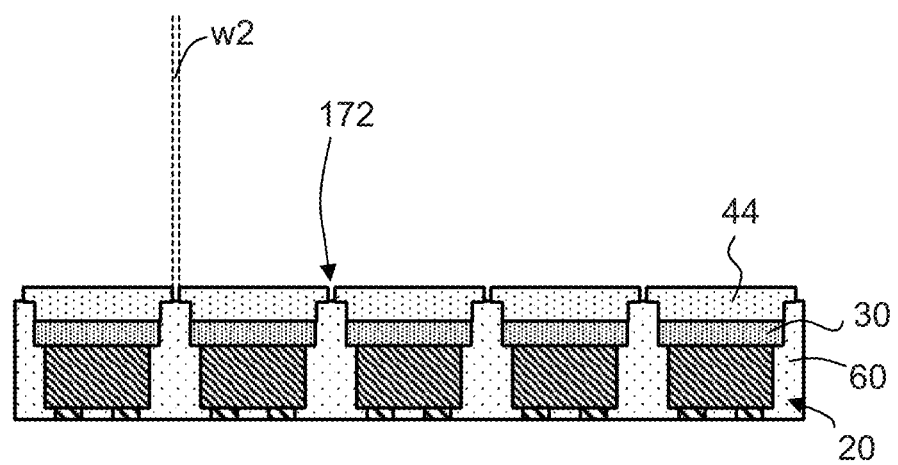
FIG. 9B is the schematic cross-sectional view showing a process in the method of manufacturing a light source according to the second embodiment.

Then second grooves that reach the light shielding member 60 are formed by partially removing the light transmissive layer 140 located between the light emitting elements from the light transmissive layer 140 side. This provides light transmissive members 40 respectively positioned on the wavelength conversion members 30. When forming the second grooves 172, as shown in FIG. 9B, the width w2 of the second grooves 172 is preferably set smaller than the width w1 of the first grooves 171. In this embodiment, the depth of the second grooves 172 is set to cut the light transmissive layer 140 and reach the first grooves 171. By forming the second grooves 172, the light transmissive layer 140 is segmentalized to form light transmissive members 44 respectively corresponding to the light emission units 54.

Other Forms

Similar to the first embodiment, by changing the shape of the blade used when forming the first grooves 171, the shape of the second lateral faces of the light transmissive member 44 in each light emission unit 54 can be changed.

Figure 10A:
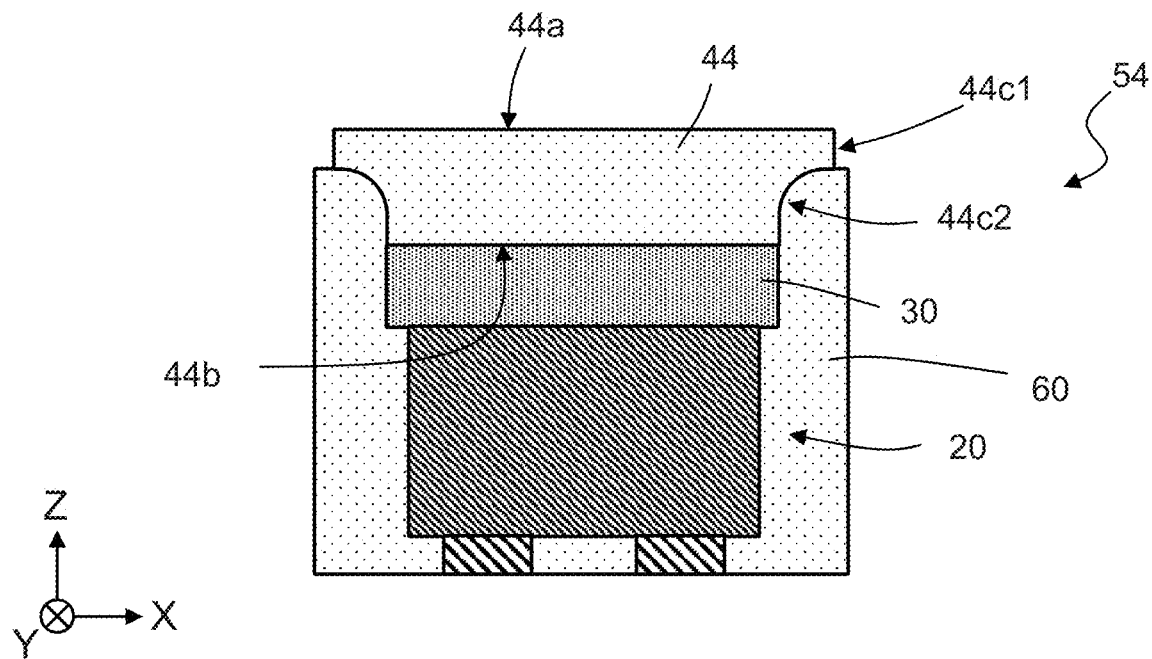
FIG. 10A is a schematic cross-sectional view of another form of a light emission unit.

In the case of forming the first grooves 171 by using a blade having a curved edge in a cross section shown in FIG. 5B, the second lateral faces 40c2 of the light transmissive member 44 each include a curved face portion as shown in FIG. 10A.

Figure 10B:
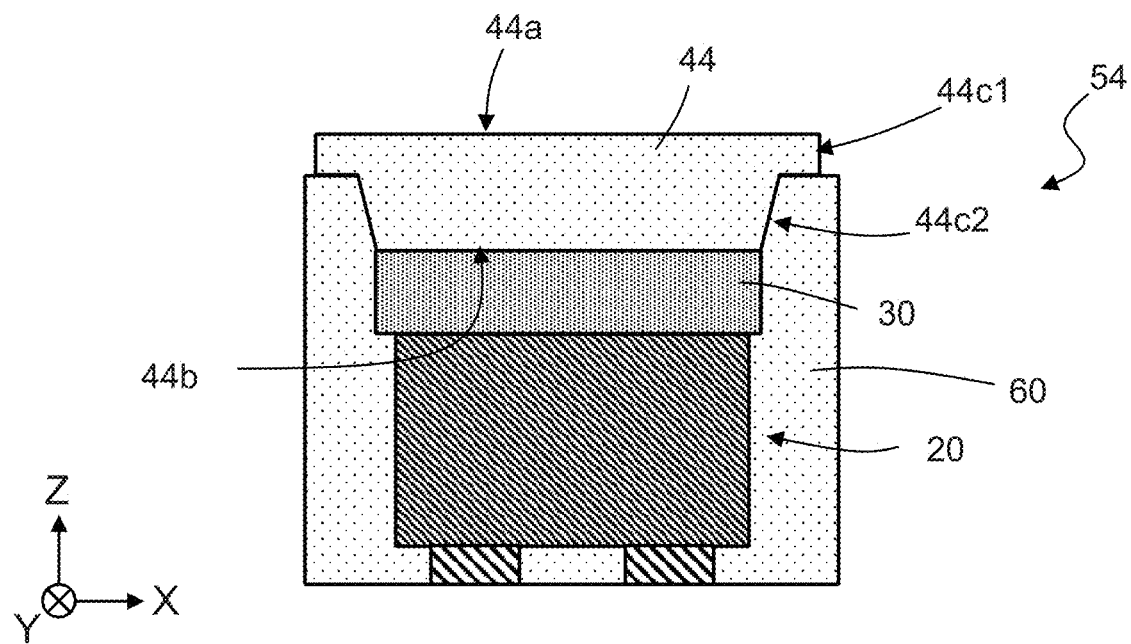
FIG. 10B is a schematic cross-sectional view of another form of a light emission unit.

In the case of forming the first grooves 171 by using a blade having a trapezoidal cross section shown in FIG. 5C, the second lateral faces 40c2 of the light transmissive member 44 are oblique to the vertical direction as shown in FIG. 10B.

Figure 10C:
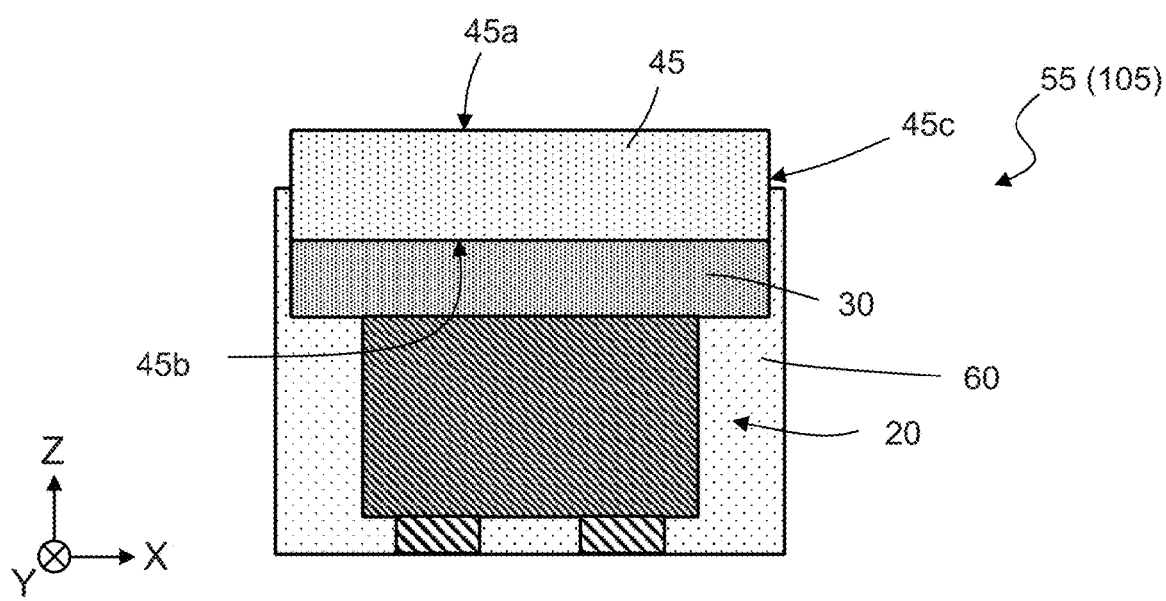
FIG. 10C is a schematic cross-sectional view of another form of a light emission unit.

Forming the first grooves 171 by using a blade having the same shape as that of the blade for forming the second grooves 172 and making the width w1 of the first grooves 171 the same as the width of the second grooves 172 can produce a light source 105 which includes light emission units 55 each equipped with the light transmissive member 45 in the form shown in FIG. 10C. The light source 105 differs from the light source 101 of the first embodiment such that the area of the upper face 45a and the area of the lower face 45b of the light transmissive member 45 are equal in each light emission unit 55. Each light transmissive member 45 has lateral faces 45c contiguous with the upper face 45a and the lower face 45b in which a portion of each lateral face 45c on the upper face 45a side is exposed from the light shielding member 60 and the other portion on the lower face 45b side is covered by the light shielding member 60.

Third Embodiment

Figure 11:
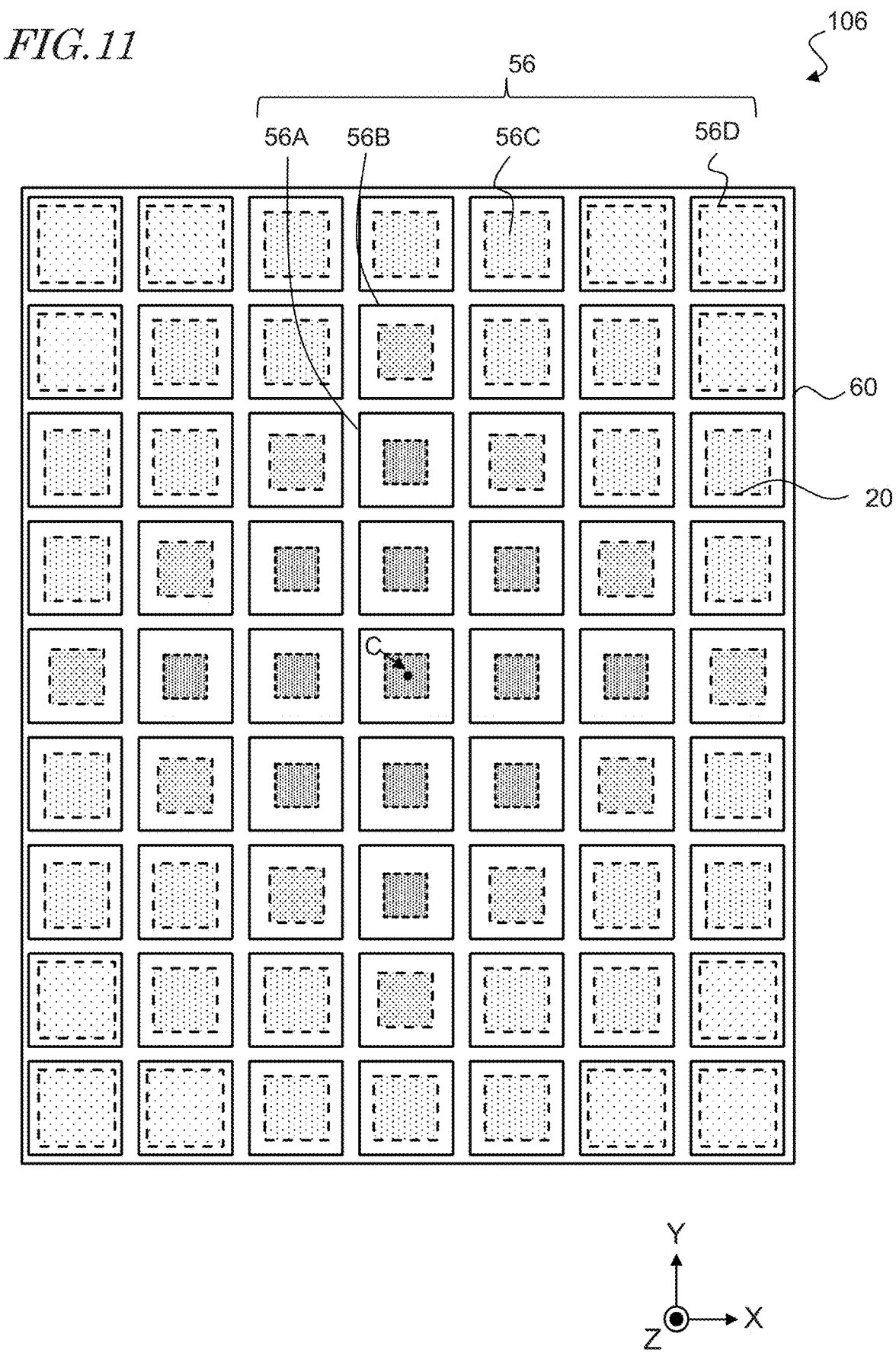
FIG. 11 is a schematic top view of a light source according to a third embodiment.

FIG. 11 is a schematic top view of a light source 106 according to a third embodiment. The light source 106 differs from the light source 101 of the first embodiment such that the light emission faces of the light emitting elements in the light emission units do not have the same size.

The light source 106 includes a plurality of two-dimensionally arranged light emission units 56. The light emission units 56 include a plurality of first light emission units 56A, a plurality of second light emission units 56B, a plurality of third light emission units 56C, and a plurality of fourth light emission units 56D.

As indicated by various hatching patterns in FIG. 11, the light emission faces 20a of the light emitting elements in the first light emission units 56A, the second light emission units 56B, the third light emission units 56C, and the fourth light emission units 56D are different. Assuming that the areas of the light emission faces 20a for the first light emission units 56A, the second light emission units 56B, the third light emission units 56C, and the fourth light emission units 56D are Aa, Ab, Ac, Ad, respectively, they satisfy the relationship, Aa<Ab<Ac<Ad.

The distances from the center C of the light emission face of the light source 106 in which the light emission units 56 are arranged the upper face of the light source 106) to the centers of the first light emission units 56A, the second light emission units 56B, the third light emission units 56C, and the fourth light emission units 56D in a top view are assumed to be ra, rb, rc, and rd, respectively. These distances for any two light emission units 56 selected in which the light emission faces 20a have different areas satisfy the relationship, ra<rb<rc<rd. In other words, the larger the light emission face 20a of the light emitting element 20 of the light emission unit, the more distant it is from the center C.

Accordingly, the second light emission units 56B are more distant from the center C than the first light emission units 56A (ra<rb), and the areas of the light emission faces 20a of the light emitting elements 20 of the second light emission units 56B are larger than the areas of the light emission faces 20a of the light emitting elements 20 of the first light emission units 56A. The first light emission units 56A similarly satisfy the relationship with the third light emission units 56C and the fourth light emission units 56D. The second light emission units 56B also similarly satisfy the relationship with the third light emission units 56C and the fourth light emission units 56D. The third light emission units 56C also similarly satisfy the relationship with the fourth light emission units 56D.

The light source 106 structured as above has higher luminance in the peripheral area than the central area of the light emission face 101a when all light emission units 56 are lit. Such light emission characteristics can achieve more appropriate lighting when used in combination with a projection lens in a lighting device. The details will be explained in relation to a fourth embodiment.

Fourth Embodiment

Figure 12A:
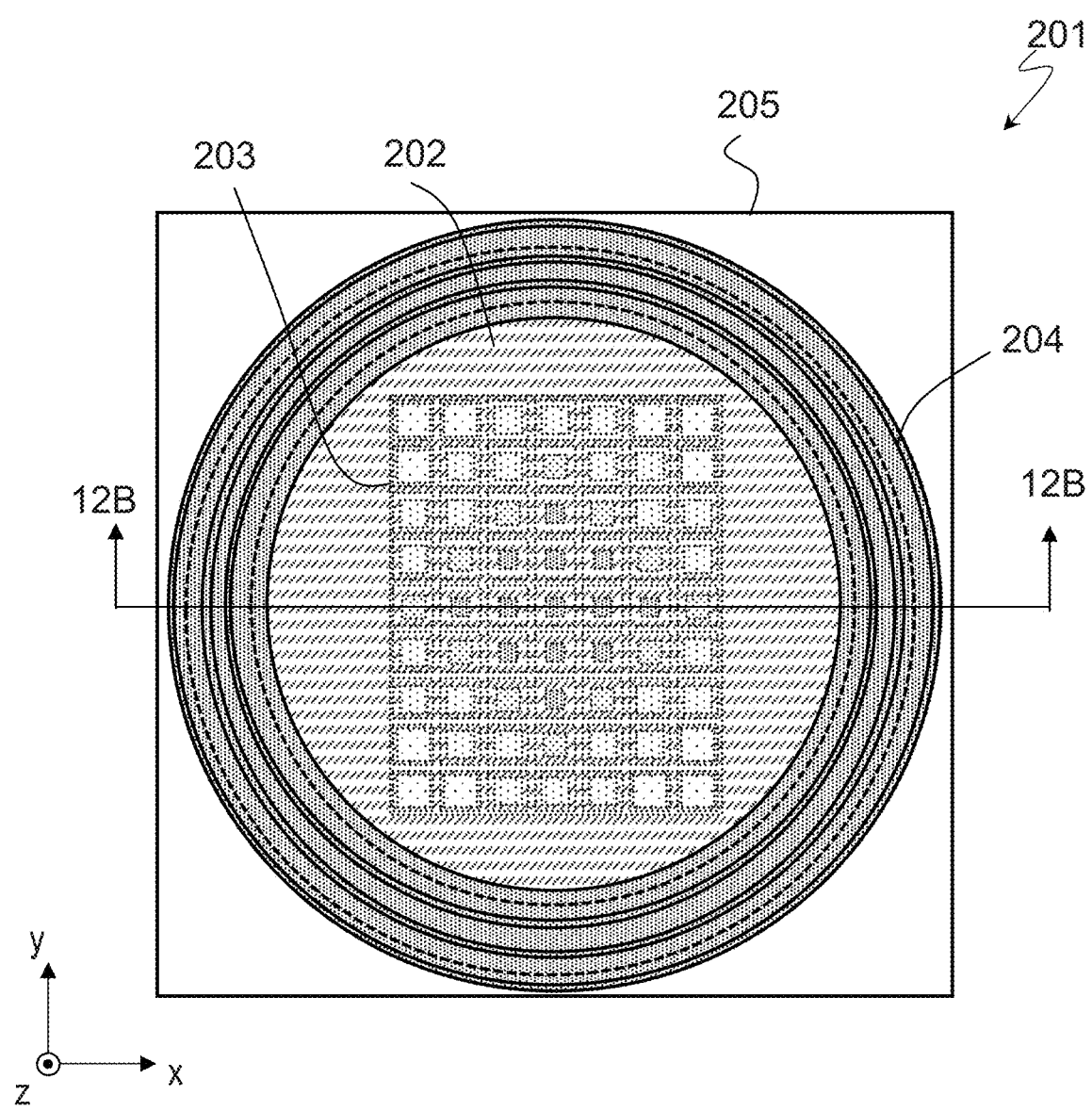
FIG. 12A is a schematic top view of a light source device according to a fourth embodiment.
Figure 12B:
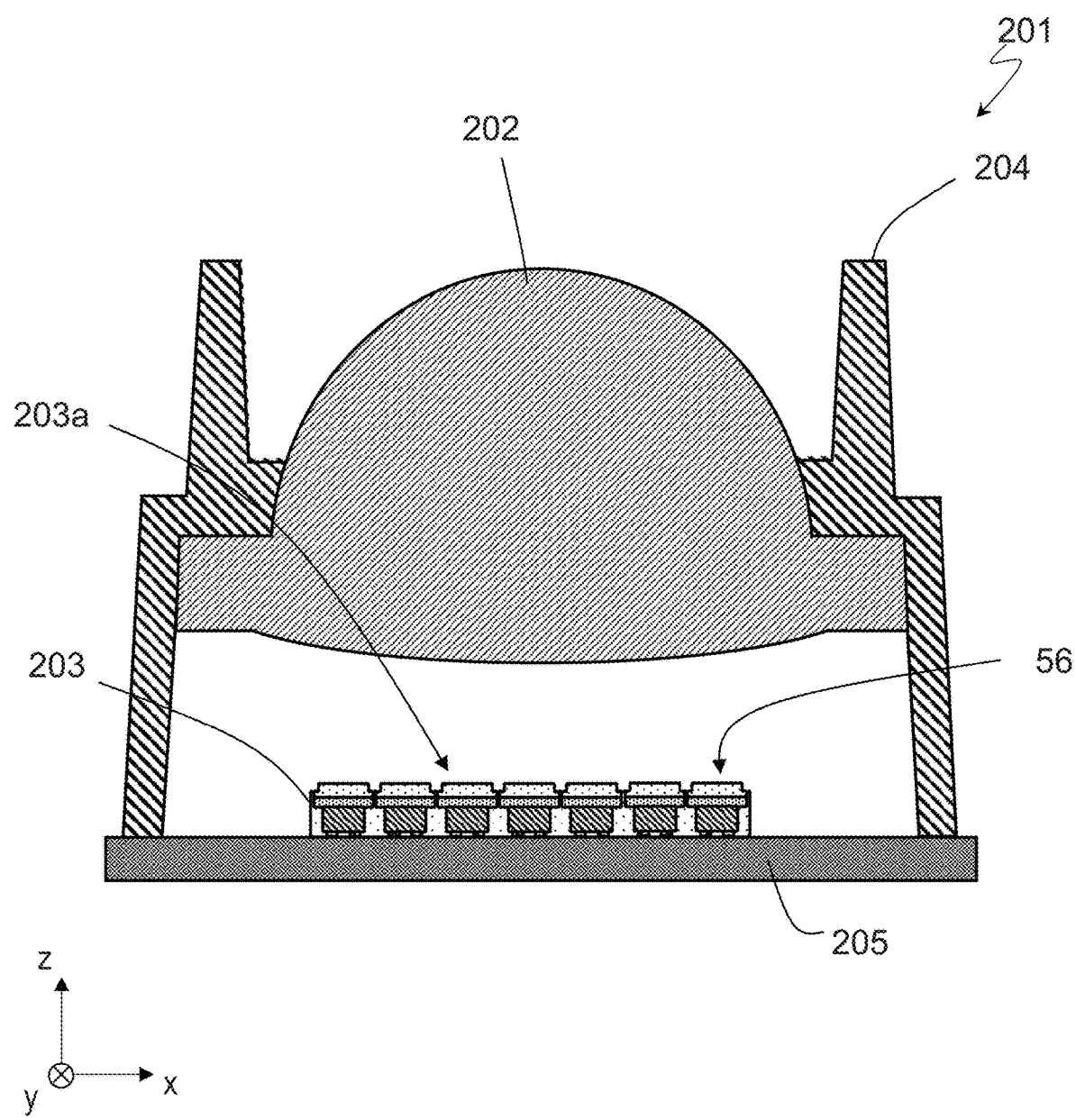
FIG. 12B is a schematic cross-sectional view of the light source device taken along line 12B-12B in FIG. 12A.

An embodiment of a light source device will be explained. FIG. 12A is a schematic front view of a light source device 201, and FIG. 128 is a schematic cross-sectional view of the light source device 201 taken along line 12B-12B in FIG. 12A.

The light source device 201 includes a lens 202 and a light source 203. In this embodiment, the light source device 201 further includes a substrate 205 and a support 204. For the light source 203, a light source according to any of the embodiments described above can be used. For example, the light source 203 is the light source 106 of the third embodiment. The light source 203 is disposed on the substrate 205. The substrate 205 provided with a drive circuit that can independently drive the light emission units 56 of the light source 203 is electrically connected to each of the light emitting elements 20 in the light emission units 57.

The support 204 retains the lens 202 at a predetermined distance from the light emission face 203a of the light source 203. The lens 202, for example, is a convex lens, and the optical axis of the lens 202 is aligned with the center of the light emission face 203a.

The lens 202 is a projection optical system and expansively projects the light from the light source 203. When the light emission units 57 are partially driven, the light having the intensity and the irradiation range corresponding to the light intensity or blinking resulting from the partial driving is projected through the lens 202.

The projected light has good emission characteristics during partial irradiation, as explained with reference to the first embodiment. Because the light exiting the light source 203 is expansively projected by the lens 202, similar to an imaging optical system, the amount of light decreases in the peripheral area. However, as explained with reference to the third embodiment, such a light amount decline is lessened because the peripheral portion of the light emission face 203a has higher luminance than the central area. Accordingly, uniform light without illuminance nonuniformity can illuminate an object.

Test Example

Figure 13A:
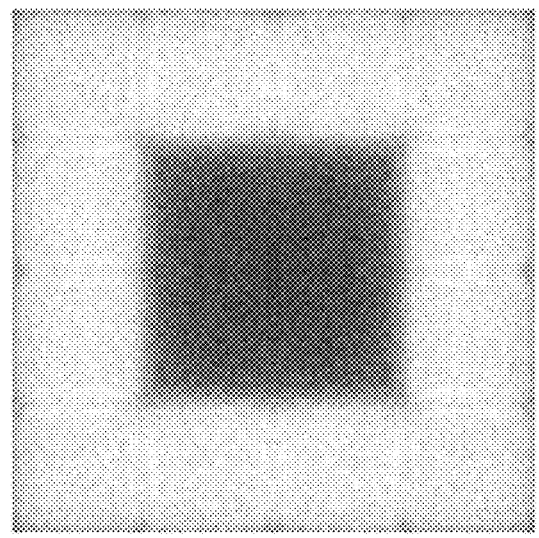
FIG. 13A shows a simulation result of the luminance distribution of the light source of a test example.
Figure 13B:
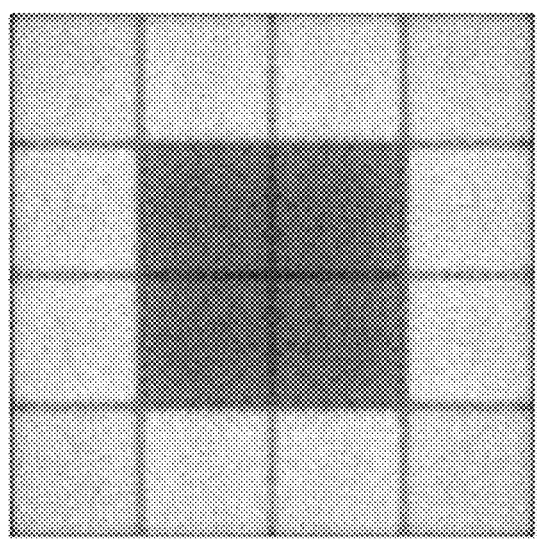
FIG. 13B shows a simulation result of the luminance distribution of the light source of a comparative example.

The luminance distribution of the light exiting a light source according to an embodiment was measured by simulation. The luminance of the light source having light emission units 51 arranged in four rows by four columns shown in FIG. 2C as a test example was measured by simulation. FIG. 13A shows the luminance distribution of the light source of the test example. As a comparative example, the luminance of a light source similar to the test example except that the light transmissive member has no lateral faces exposed from the light shielding member was measured by simulation. FIG. 13B shows the luminance distribution of the light source of the comparative example. In the light emission units 51 of the test example, the thickness t1 of each first region R1 (FIG. 2C) was 60 μm, the thickness t2 of each second region R2 was 30 μm. The light emission units of the comparative example had no first regions R1, and the thickness of each light transmissive member was 30 μm. The distance between the lateral faces of the light transmissive members and between the lateral faces of the wavelength conversion members facing via the light shielding member was 25 μm in both the test and comparative examples. FIG. 13A and FIG. 13B each show the luminance distribution when the four light emission units in the center were not lit, i.e., the 12 light emission units in the peripheral area were lit. In FIGS. 13A and 13B, the whiter the area, the higher the luminance is.

As is understood from FIGS. 13A and 13B, in the test example, there is hardly any region with reduced luminance between the lit light emission units in the peripheral area, whereas in the comparative example, there are low luminance regions between the light emission units. In the test example, the contrast between the lit area and the unlit area is high, whereas in the comparative example, the contrast between the lit and unlit areas is low. This shows that the light source of this example has good emission characteristics during partial irradiation.

Any of the light sources and light source devices according to the present invention can be used as a light emitting device in various applications. For example, it can be suitably used as a light emitting device for various lighting applications.

What is claimed is:
1. A light source comprising:
a plurality of light emission units arranged one-dimensionally or two-dimensionally, with at least one of the light emission units including
a light emitting element having a light emission face,
a wavelength conversion member disposed on the light emission face, and
a light transmissive member disposed on an upper face of the wavelength conversion member, the light transmissive member including a first region positioned above the light emitting element and a second region positioned outward from the first region in a top view, the second region having a thickness smaller than a thickness of the first region,
the wavelength conversion member being larger than the light emission face of the light emitting element in the top view; and
a light shielding member continuously disposed between adjacent ones of the light emission units, the light shielding member covering a lateral face of the light emitting element and a lateral face of the wavelength conversion member in the at least one of the light emission units, wherein
a lateral face of the light transmissive member in the at least one of the light emission units is at least partially exposed from the light shielding member.

2. The light source according to claim 1, wherein
the light transmissive member of the at least one of the light emission units has an upper face and a lower face located opposite to the upper face, the lower face of the light transmissive member facing the upper face of the wavelength conversion member,
the lateral face of the light transmissive member is positioned between the upper face and the lower face,
the lateral face of the light transmissive member includes in a height direction a first lateral face contiguous with the upper face of the light transmissive member, and a second lateral face contiguous with the lower face of the light transmissive member,
the first lateral face is exposed from the light shielding member, and
the second lateral face is covered by the light shielding member.

3. The light source according to claim 2, wherein
an area of the upper face of the light transmissive member is smaller than an area of the lower face of the light transmissive member.

4. The light source according to claim 2, wherein
an area of the upper face of the light transmissive member is larger than an area of the lower face of the light transmissive member.

5. The light source according to claim 3, wherein
the light transmissive member has an intermediary face positioned between the first lateral face and the second lateral face of the light transmissive member, the intermediary face extending substantially in parallel with the upper face or the lower face of the light transmissive member.

6. The light source according to claim 3, wherein
the first lateral face of the light transmissive member has a curved face portion, and
the second lateral face is planar.

7. The light source according to claim 1, wherein
the lateral face of the light transmissive member of the at least one of the light emission units is entirely exposed from the light shielding member.

8. The light source according to claim 1, wherein
an area of the first region of the light transmissive member is larger than an area of the light emission face of the light emitting element in the top view.

9. The light source according to claim 1, wherein
the light transmissive member contains a light diffusing material.

10. The light source according to claim 1, wherein
the light emission units are two-dimensionally arranged in a predetermined region in the top view, and include a first light emission unit and a second light emission unit,
the second light emission unit is more distant from a center of the predetermined region than the first light emission unit, and
the light emission face of the light emitting element in the second light emission unit is larger than the light emission face of the light emitting element in the first light emission unit.

11. A light source device comprising:
the light source according to claim 1; and
a lens disposed at a predetermined distance from the light source.

12. A method of manufacturing a light source, the method comprising:
bonding a plurality of light emitting elements to a wavelength conversion layer of a stacked body so that the plurality of light emitting elements are arranged one-dimensionally or two-dimensionally and a light emission face of each of the light emitting elements faces the wavelength conversion layer, the light emitting elements each having the light emission face and an electrode face located opposite to the light emission face, the stacked body including the wavelength conversion layer and a light transmissive layer;
forming a first groove in the stacked body from a wavelength conversion layer side in a region between adjacent ones of the light emitting elements to segmentalize the stacked body into a plurality of sets of a wavelength conversion member and a light transmissive member respectively corresponding to each of the light emitting elements;
disposing a light shielding member between the adjacent ones of the light emitting elements to cover lateral faces of the adjacent ones of the light emitting elements, lateral faces of the wavelength conversion members, and lateral faces of the light transmissive members; and
forming a second groove in faces of the light transmissive members not facing the wavelength conversion members by removing at least a portion of the light shielding member located between adjacent ones of the light transmissive members to expose at least portions of the lateral faces of the adjacent ones of the light transmissive members from the light shielding member.

13. The method of manufacturing a light source according to claim 12, wherein
the forming of the second groove includes only partially exposing the lateral faces of the adjacent ones of the light transmissive members.

14. The method of manufacturing a light source according to claim 12, wherein
the forming of the second groove includes further removing portions of outer edges of the adjacent ones of the light transmissive members so that lateral faces at the outer edges of the adjacent ones of the light transmissive members are exposed from the light shielding member.

15. The method of manufacturing a light source according to claim 12, wherein
the forming of the second groove includes forming the second groove so that a width of the second groove is smaller than a width of the first groove.

16. The method of manufacturing a light source according to claim 12, wherein
the forming of the second groove includes forming the second groove so that a width of the second groove is the same as a width of the first groove.

17. The method of manufacturing a light source according to claim 12, wherein
the forming of the second groove includes forming the second groove so that a width of the second groove is larger than a width of the first groove.

18. The method of manufacturing a light source according to claim 17, wherein
the forming of the second groove includes forming the second groove so that a cross-sectional shape of the second groove is a shape selected from the group consisting of a quadrangle, a trapezoid, and a U shape.

19. The method of manufacturing a light source according to claim 12, wherein
the forming of the first groove includes forming the first groove to segmentalize the wavelength conversion layer into the wavelength conversion members so that each of the wavelength conversion members is larger than the light emission face of a corresponding one of the light emitting elements in a top view.

20. The method of manufacturing a light source according to claim 12, further comprising
providing the stacked body including the light transmissive layer containing a light diffusing material.

21. The method of manufacturing a light source according to claim 12, wherein
the bonding of the light emitting elements includes arranging the light emitting elements two-dimensionally in a predetermined region, the light emitting elements including a first light emitting element and a second light emitting element with the light emission face of the second light emitting element being larger than the light emission face of the first light emitting element, so that the second light emitting element is more distant from a center of the predetermined region than the first light emitting element.

22. A method of manufacturing a light source, the method comprising:
bonding a plurality of light emitting elements to a wavelength conversion layer of a stacked body so that the plurality of light emitting elements are arranged one-dimensionally or two-dimensionally and a light emission face of each of the light emitting elements faces the wavelength conversion layer, the light emitting elements each having the light emission face and an electrode face located opposite to the light emission face, the stacked body including the wavelength conversion layer and a light transmissive layer;
forming a first groove in the stacked body from a wavelength conversion layer side in a region between adjacent ones of the light emitting elements so that the first groove reaches the light transmissive layer to segmentalize the wavelength conversion layer into a plurality of wavelength conversion members respectively corresponding to the light emitting elements;
disposing a light shielding member between adjacent ones of the light emitting elements to cover lateral faces of the light emitting elements, lateral faces of the wavelength conversion members, and exposed portions of the light transmissive layer in the first groove; and forming a second groove in the light transmissive layer by partially removing the light transmissive layer from a light transmissive layer side in a region between adjacent ones of the light emitting elements so that the second groove reaches the light shielding member to segmentalize the light transmissive layer into a plurality of light transmissive members respectively positioned on the wavelength conversion members.

* * * * *